United States Patent
Funakubo et al.

(10) Patent No.: US 12,359,300 B2
(45) Date of Patent: Jul. 15, 2025

(54) METHOD FOR PRODUCING FERROELECTRIC FILM, FERROELECTRIC FILM, AND USAGE THEREOF

(71) Applicant: Tokyo Institute of Technology, Tokyo (JP)

(72) Inventors: Hiroshi Funakubo, Tokyo (JP); Takao Shimizu, Tokyo (JP); Takanori Mimura, Tokyo (JP); Yoshiko Nakamura, Tokyo (JP); Reijiro Shimura, Tokyo (JP); Yu-ki Tashiro, Tokyo (JP)

(73) Assignee: Tokyo Institute of Technology, Tokyo (JP)

( * ) Notice: Subject to any disclaimer, the term of this patent is extended or adjusted under 35 U.S.C. 154(b) by 623 days.

(21) Appl. No.: 17/606,440

(22) PCT Filed: Apr. 27, 2020

(86) PCT No.: PCT/JP2020/018031
§ 371 (c)(1),
(2) Date: Oct. 25, 2021

(87) PCT Pub. No.: WO2020/218617
PCT Pub. Date: Oct. 29, 2020

(65) Prior Publication Data
US 2022/0178012 A1    Jun. 9, 2022

(30) Foreign Application Priority Data

Apr. 26, 2019  (JP) ................................ 2019-086836
Apr. 26, 2019  (JP) ................................ 2019-086840

(51) Int. Cl.
C23C 14/08     (2006.01)
C01G 27/00     (2006.01)
(Continued)

(52) U.S. Cl.
CPC .......... *C23C 14/083* (2013.01); *C01G 27/006* (2013.01); *C01G 27/02* (2013.01);
(Continued)

(58) Field of Classification Search
CPC ... C23C 14/083; C23C 14/34; C23C 14/5806; H01L 21/02197
See application file for complete search history.

(56) References Cited

U.S. PATENT DOCUMENTS

2013/0234564 A1    9/2013   Sakashita et al.

FOREIGN PATENT DOCUMENTS

JP    2001-146421 A    5/2001
JP    2012-106902 A    6/2012
(Continued)

OTHER PUBLICATIONS

International Search Report dated Jun. 30, 2020 issued in International Application No. PCT/JP2020/018031, with English translation, 7 pages.
(Continued)

Primary Examiner — Kelly M Gambetta
(74) Attorney, Agent, or Firm — Foley & Lardner LLP

(57) ABSTRACT

Provided is a method for forming a ferroelectric film of a metal oxide having a fluorite-type structure at a low temperature of lower than 300° C., and a ferroelectric film obtained at a low temperature. The present invention provides a production method of a ferroelectric film comprising a crystalline metal oxide having a fluorite-type structure of an orthorhombic crystal phase, which comprises using a film sputtering method comprising sputtering a target at a substrate temperature of lower than 300° C., to deposit on the substrate a film of a metal oxide which is capable of having a fluorite-type structure of an orthorhombic crystal phase, and having a subsequent thermal history of said film of
(Continued)

lower than 300° C.; or applying an electric field to said film after said deposition or after said thermal history of lower than 300° C. Also provided are the ferroelectric film, which is formed on an organic substrate, glass, or metal substrate, which can be used only at low temperatures, and a ferroelectric element and a ferroelectric functional element or device using the ferroelectric film.

4 Claims, 33 Drawing Sheets

(51) Int. Cl.
| | | |
|---|---|---|
| *C01G 27/02* | (2006.01) | |
| *C23C 14/34* | (2006.01) | |
| *C23C 14/58* | (2006.01) | |
| *H01L 21/02* | (2006.01) | |
| *H10N 30/077* | (2023.01) | |
| *C30B 29/22* | (2006.01) | |

(52) U.S. Cl.
CPC .......... *C23C 14/34* (2013.01); *C23C 14/5806* (2013.01); *H10N 30/077* (2023.02); *C30B 29/22* (2013.01); *H01L 21/02197* (2013.01)

(56) References Cited

FOREIGN PATENT DOCUMENTS

| | | | |
|---|---|---|---|
| JP | 2016-031986 A | 3/2016 | |
| WO | WO-2016031986 A1 * | 3/2016 | ............. C01G 27/00 |

OTHER PUBLICATIONS

U. Schroeder et al., "Hafnium Oxide Based CMOS Compatible Ferroelectric Materials," ECS Journal of Solid State Science and Technology, 2 (4) N69-N72 (2013), 5 pages.

Uwe Schroeder et al., "Impact of different dopants on the switching properties of ferroelectric hafniumoxide," Japanese Journal of Applied Physics, 53, 08LE02 (2014), 6 pages.

* cited by examiner

FIG. 3

| Memory | | Transistor | | | Capacitor | Cooling device (Electric heat effect) Generator (Pyrogenerator) |
|---|---|---|---|---|---|---|
| Ferroelectric memory (ReRAM, FRAM) | Resistance change memory (RRAM Tunnel junction) | Piezotransistor (PET) | | | | |

Ferroelectric memory (ReRAM, FRAM):
- M: Metal / F: Ferroelectric / M: Metal
- M: Metal / F: Ferroelectric / S: Semiconductor (Si, SiC, GaN)
- M: Metal / F: Ferroelectric / I: Insulator / S: Semiconductor (Si, SiC, GaN)
- M: Metal / F: Ferroelectric / M: Metal / I: Insulator / S: Semiconductor (Si, SiC, GaN)

Resistance change memory (RRAM Tunnel junction):
- M: Metal / F: Ferroelectric / M: Metal Piezotransistor (PET):
- M: Metal / F: Ferroelectric / M: Metal
- S: Semiconductor / F: Ferroelectric / M: Metal
- I: Insulator / F: Ferroelectric / M: Metal Capacitor:
- M: Metal / F: Ferroelectric / M: Metal Generator (Pyrogenerator):
- M: Metal / F&AF&I: Ferroelectric (Antiferroelectric, Dielectric) / M: Metal FIG. 14
(a)
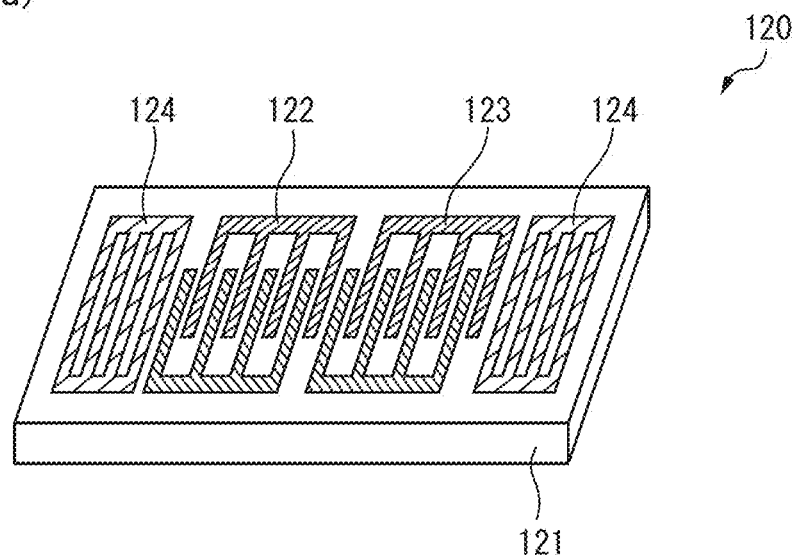
(b)
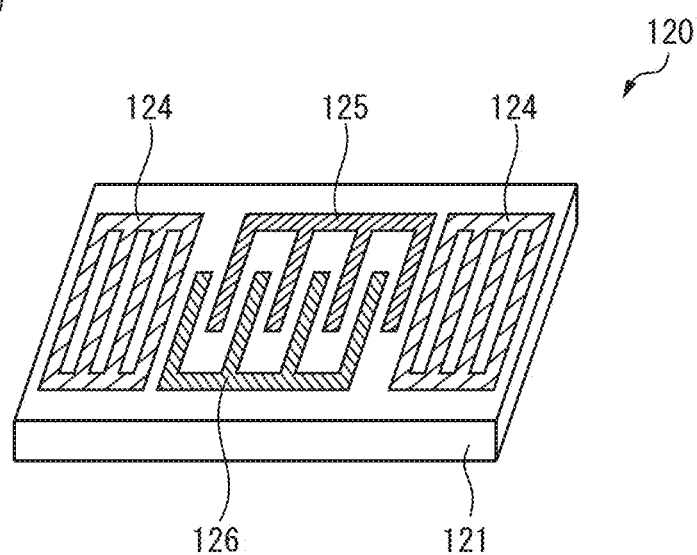

(d)

(e)

FIG. 18
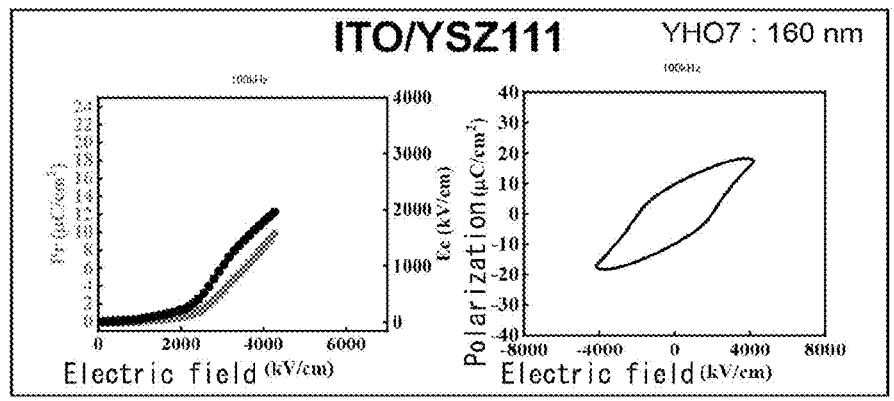
(a)
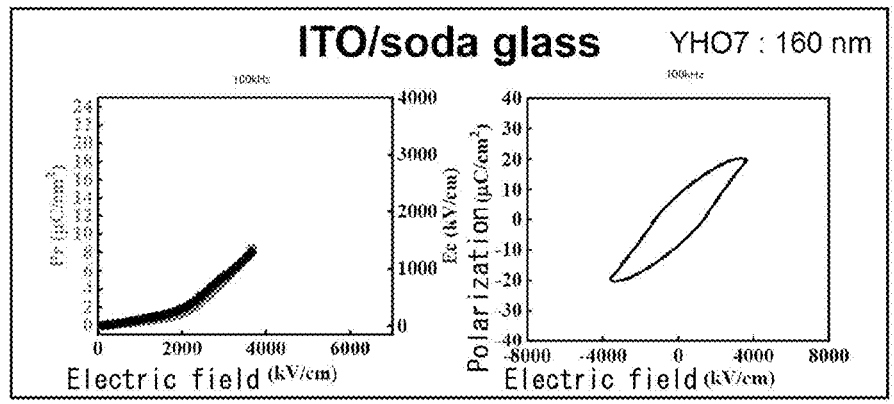
(b)
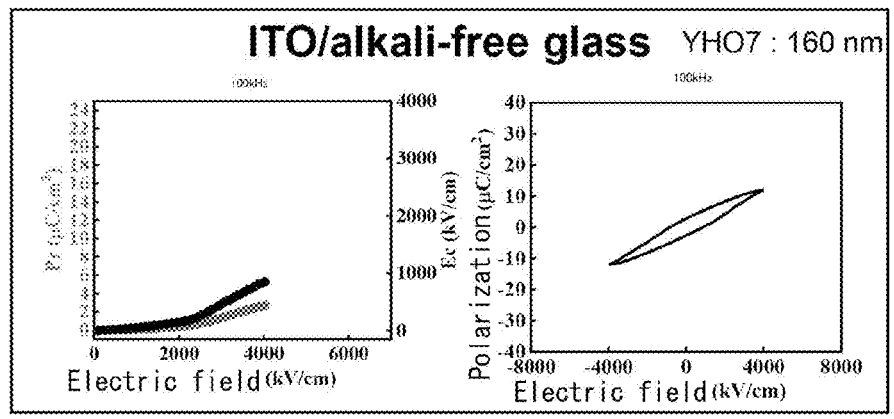
(c)
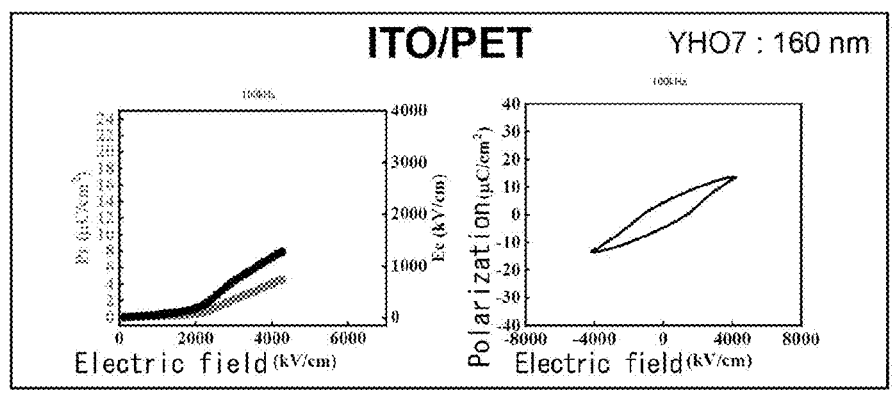
(d)

(a)

(b)

(a)

(b)

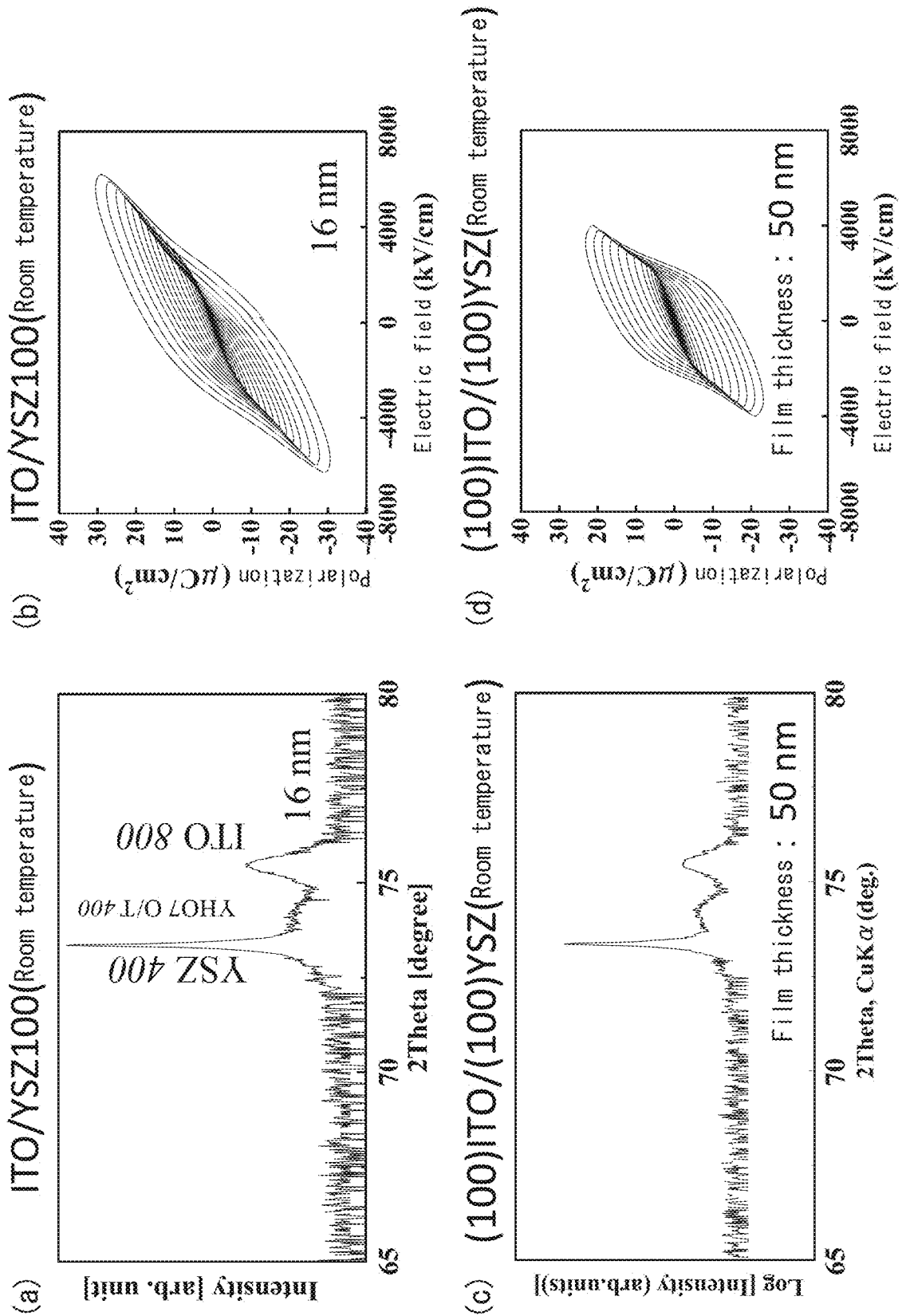

FIG. 30
16 nm 7%Y doped HfO$_2$
(a) 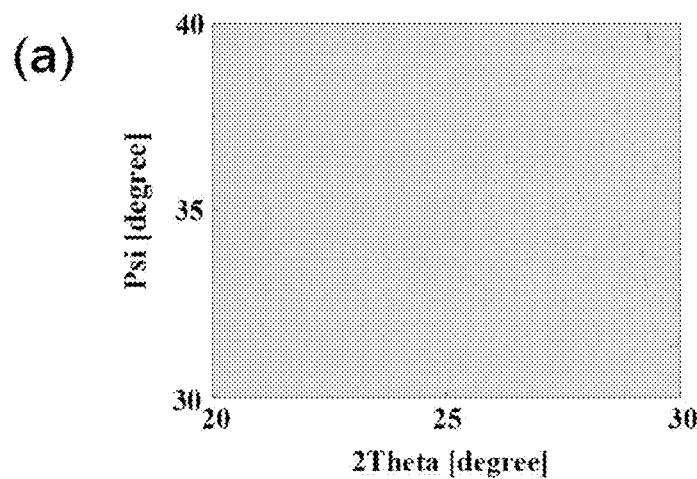
14 nm 5%Y doped HfO$_2$
(b) 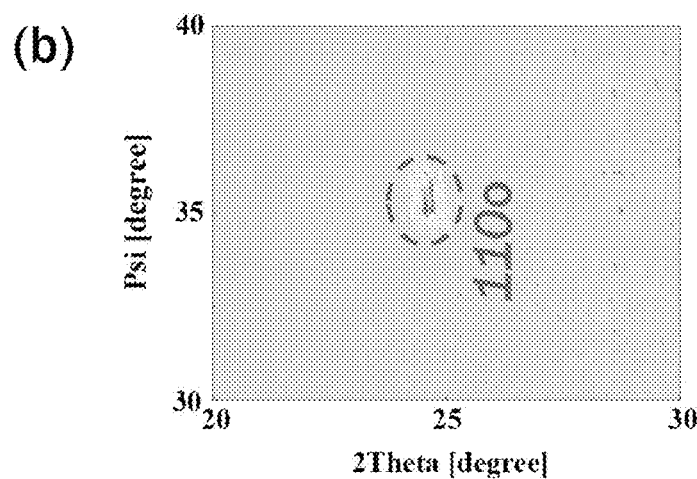

FIG. 31
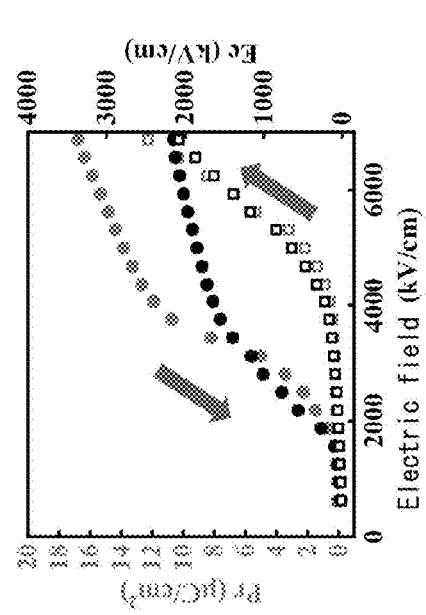
(a)
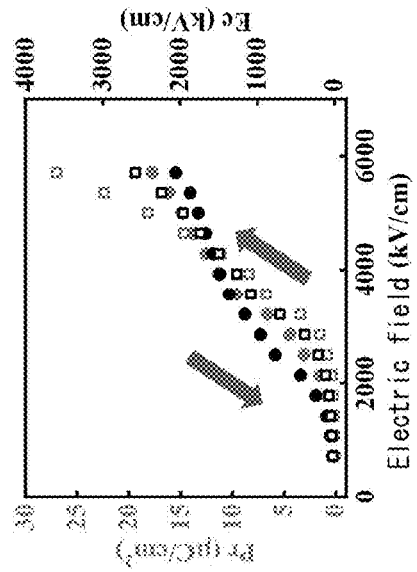
(c)
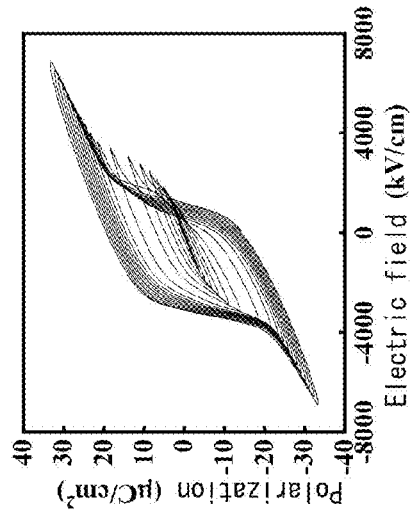
(b)
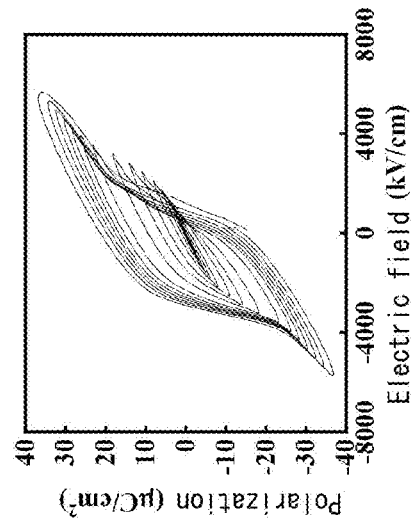
(d)

METHOD FOR PRODUCING FERROELECTRIC FILM, FERROELECTRIC FILM, AND USAGE THEREOF

CROSS-REFERENCE TO RELATED APPLICATIONS

This application is the U.S. National Stage of PCT/JP2020/018031, filed Apr. 27, 2020, which claims priority to JP 2019-086836, filed Apr. 26, 2019 and JP 2019-086840, filed Apr. 26, 2019.

FIELD

The present invention relates to a production method of a ferroelectric film, a ferroelectric film obtained therewith, and uses of the ferroelectric film such as a capacitor, electro-optical element, memory element, transistor, pyroelectric element, and piezoelectric element.

BACKGROUND

Conventionally, as ferroelectric materials, barium titanate $BaTiO_3$, lead zirconate titanate Pb $(Zr, Ti)O_3$, $(Pb, La)(Zr, Ti)O_3$, and $BiFeO_3$ are known. Ferroelectrics are a type of dielectric, and "ferroelectric" indicates a substance in which electric dipoles are aligned in the absence of an external electric field and the direction of dipoles can be changed by an electric field. Since ferroelectrics are dielectrics having not only ferroelectricity but also pyroelectricity and piezoelectricity, they are also used as capacitors, electro-optical elements, memory elements, transistors, pyroelectric elements, and piezoelectric elements. Piezoelectric materials, which are ferroelectric substances, are substances in which when a pressure is applied to the substance, polarization proportional to the pressure appears, and conversely, when an electric field is applied, the substance is deformed. Piezoelectric materials are widely used as piezoelectric elements in igniters, sonars, and speakers, Ferroelectric characteristics have been reported in films using $HfO_2$-based solid solution materials, which are metal oxides having a fluorite-type structure of an orthorhombic crystal phase (Non-Patent Literature 1 and 2). Conventional ferroelectric materials are composite oxides having a perovskite-based structure, which have problems such as a large number of constituent elements (4 or more elements), large fluctuations in composition and crystal structure, toxic constituent elements, high vapor pressure, and difficulty in controlling composition by volatilization, whereas since $ZrO_2$ and $HfO_2$ solid solution materials have a fluorite-type structure and are simple oxides, the number of constituent elements is small, fluctuations in composition and crystal structure are small, reproducibility is excellent, and it is not necessary to use toxic constituent elements, and they have features such as the capability of being formed into a film, and it is considered that the usability thereof as a ferroelectric substance film, which is a material having a fluorite-type structure, is high.

Known methods for forming an inorganic ferroelectric substance film include the sputtering method, the sol-gel method, the CVD (Chemical Vapor Deposition) method, the PLD (Pulsed Laser Deposition) method, the ALD (Atomic Layer Deposition) method, and the hydrothermal synthesis method (for example, Patent Literature 1 and Patent Literature 2). Among these known methods, in methods other than the hydrothermal synthesis method, an inorganic ferroelectric substance film cannot have been obtained unless it was deposited at a high temperature of 300° C. or higher or annealed at a high temperature of 300° C. or higher after deposition. Thus, in addition to the problems of productivity and cost, the substrates which can be used are required to have heat resistance, and there is a drawback in that an organic substrate cannot be used. Conversely, the hydrothermal synthesis method can be used to obtain an inorganic ferroelectric at a temperature of 300° C. or lower, but there is a problem in that the hydrothermal synthesis method cannot be used, depending on the use, because it is a wet-type process.

CITATION LIST

Patent Literature

[PTL 1] JP PCT Re-publication No. 2016-031986
[PTL 2] Japanese Unexamined Patent Publication (Kokai) No. 2012-106902

Non-Patent Literature

[NPL 1] U. Schroeder et al, ECS, J. Solid State Sci. Technol. 2013, Volume 2, Issue 4, Pages N69-N71
[NPL 2] U. Schroeder et al, Japanese Journal of Applied Physics 53, 08LE02 (2014)

SUMMARY

Technical Problem

An object of the present invention is to provide a method for producing a ferroelectric substance film of a metal oxide having a fluorite-type structure of an orthorhombic crystal phase (or an orthorhombic crystal phase of a fluorite-type structure) at a low temperature of lower than 300° C., the obtained ferroelectric substance film, and a functional element or device using the ferroelectric substance film.

Solution to Problem

In order to achieve the above object, the present invention provides at least the following aspects.
(Aspect 1)
A production process of a ferroelectric film, which comprises
using a sputtering method comprising sputtering a target at a temperature of a substrate of lower than 300° C., to deposit on the substrate a film of a metal oxide which is capable of having a fluorite-type structure of an orthorhombic crystal phase, and
having a subsequent thermal history of said film of lower than 300° C., or applying an electric field to said film after said deposition or after said thermal history of lower than 300° C.,
whereby a ferroelectric film comprising a crystalline metal oxide having a fluorite-type structure of an orthorhombic crystal phase is produced.
(Aspect 2)
The production method of a ferroelectric film according to Aspect 1, wherein the metal of said metal oxide comprises hafnium (Hf), zirconium (Zr), cerium (Ce), or two or more of these, or comprises hafnium (Hf), zirconium (Zr), cerium (Ce) or two or more of these and at least one metal element selected from aluminum (Al), silicon (Si), strontium (Sr), barium (Ba) and rare earth elements (Sc, Y, La, Ce, Pr, Nd, Sm, Eu, Gd, Tb, Dy, Ho, Er, Tm, Yb, and Lu).

(Aspect 3)

The production method of a ferroelectric film according to Aspect 1 or 2, wherein said sputtering is carried out in an inert atmosphere having an oxygen partial pressure of less than 1%.

(Aspect 4)

The production method of a ferroelectric film according to any one of Aspects 1 to 3, wherein said substrate is any of a substrate comprising a glass having a glass transition point of lower than 300° C., a substrate comprising a macromolecular organic layer, a substrate comprising a metal layer having a softening temperature of lower than 300° C., and an inside of a semiconductor device.

(Aspect 5)

A ferroelectric film obtained by the production method of any one of Aspects 1 to 4.

(Aspect 6)

A ferroelectric film comprising a crystalline metal oxide having a fluorite-type structure of an orthorhombic crystal phase, provided on a substrate which is any of a substrate comprising a glass having a glass transition point of lower than 300° C., a substrate comprising a macromolecular organic layer, and a substrate comprising a metal layer having a softening temperature of lower than 300° C.

(Aspect 7)

The ferroelectric film according to Aspect 5 or 6, wherein the metal of said metal oxide comprises hafnium (Hf), zirconium (Zr), cerium (Ce), or two or more of these, or comprises hafnium (Hf), zirconium (Zr), cerium (Ce), or two or more of these and at least one metal element selected from aluminum (Al), silicon (Si), strontium (Sr), barium (Ba) and rare earth elements (Sc, Y, La, Ce, Pr, Nd, Sm, Eu, Gd, Tb, Dy, Ho, Er, Tm, Yb, and Lu).

(Aspect 8)

The ferroelectric film according to any one of Aspects 5 to 7, wherein a conductive film is provided between said substrate and said ferroelectric film.

(Aspect 9)

A ferroelectric functional element, comprising said ferroelectric film according to any one of Aspects 5 to 8, and a pair of electrodes.

(Aspect 10)

The ferroelectric functional element according to Aspect 9, wherein the ferroelectric functional element is selected from a capacitor, electro-optical element, memory element, transistor, ferroelectric data storage, pyroelectric element, and piezoelectric element.

(Aspect 11)

The ferroelectric functional element according to Aspect 9, wherein the ferroelectric functional element is one selected from an actuator, inkjet head, gyro sensor, vibration power generator, surface acoustic wave resonator, film bulk wave resonator, piezoelectric mirror, and piezoelectric sensor.

Advantageous Effects of Invention

According to the present invention, a method for the production of a ferroelectric film comprising a crystalline metal oxide having a fluorite-type structure of an orthorhombic crystal phase at a temperature as low as lower than 300° C. is provided. Since a heat treatment at a temperature of 300° C. or higher is not required, productivity and cost can be improved, organic materials or soda glass having low heat resistance can be used as the substrate, and an unprecedented ferroelectric functional element or device using these ferroelectric films and substrates can be provided.

BRIEF DESCRIPTION OF DRAWINGS

FIG. 3 is a cross-sectional view showing examples of laminate structures comprising a ferroelectric film in ferroelectric functional elements.

FIG. 14 is a schematic view showing an example of a Surface Acoustic Wave (SAW) resonator.

FIG. 16-1 is a schematic view showing an example of a piezoelectric mirror.

FIG. 16-2 is a schematic view (continuation) showing an example of a piezoelectric mirror.

FIG. 18 is a chart showing polarization hysteresis measurement results (polarization-electric field relationship) of the 7% $YO_{1.5}$-93% $HfO_2$ films obtained in Examples 1 to 4.

FIG. 20-1 is an X-ray diffraction analysis chart and a chart showing polarization hysteresis measurement results (polarization-electric field relationship) of the 7% $YO_{1.5}$-93% $HfO_2$ film obtained in Example 6.

FIG. 20-2 shows polarization measurement results by PUND (Positive-up-negative-down) of the 7% $YO_{1.5}$-93% $HfO_2$ film obtained in Example 6.

FIG. 21-1 is an X-ray diffraction analysis chart and a chart showing polarization hysteresis measurement results (polarization-electric field relationship) of the 7% $YO_{1.5}$-93% $HfO_2$ film obtained in Example 7.

FIG. 21-2(a) shows a transmission electron microscope bright field image of the 7% $YO_{1.5}$-93% $HfO_2$ film obtained in Example 7, FIG. 21-2(b) shows a select area electron diffraction image of the 7% $YO_{1.5}$-93% $HfO_2$ film, and FIG. 21-2(c) shows a transmission electron microscope dark field image captured using the 222 diffraction of FIG. 21-2(b)

FIG. 22 an X-ray diffraction analysis chart and a chart showing polarization hysteresis measurement results (polarization-electric field relationship) of the 7% $YO_{1.5}$-93% $HfO_2$ film obtained in Example 8.

FIG. 23-1 is polarization hysteresis measurement results (polarization-electric field relationship) and an X-ray diffraction analysis chart of the 7% $YO_{1.5}$-93% $HfO_2$ film obtained on a part of a substrate (Pt/Si) in Example 9.

FIG. 23-2 shows polarization measurement results by PUND (Positive-up-negative-down) of the 7% $YO_{1.5}$-93% $HfO_2$ film on a Pt/Si substrate.

FIG. 30 shows an X-ray diffraction analysis chart of the 7% $YO_{1.5}$-93% $HfO_2$ film and the 5% $YO_{1.5}$-95% $HfO_2$ film obtained in Example 16. FIG. 30(a) is a 2-Theta-Psi map near the 110 superlattice diffraction of a 7% $YO_{1.5}$-93% $HfO_2$ film deposited on an ITO/(111)YSZ substrate at room temperature. FIG. 30(b) is a 2-Theta-Psi map near the 110 superlattice diffraction of a 5% $YO_{1.5}$-95% $HfO_2$ film deposited on an ITO/(111)YSZ substrate at room temperature.

FIG. 31 shows polarization hysteresis measurement results (polarization-electric field relationship) of the 7% $YO_{1.5}$-93% $HfO_2$ film and the 5% $YO_{1.5}$-95% $HfO_2$ film obtained in Example 16. FIG. 31(a) shows the result of polarization hysteresis measurement (polarization-electric field relationship) of the 7% $YO_{1.5}$-93% $HfO_2$ film. FIG. 31(b) shows the results of polarization hysteresis measurement (polarization-electric field relationship) of the 5% $YO_{1.5}$-95% $HfO_2$ film. FIGS. 31(c) and 31(d) show the residual polarization value Pr and the voltage dependence of the coercive electric field Ec of the 7% $YO_{1.5}$-93% $HfO_2$ film and the 5% $YO_{1.5}$-95% $HfO_2$ film.

DESCRIPTION OF EMBODIMENTS (Production Method of Ferroelectric Film)

In one aspect, the present invention provides a production process of a ferroelectric film, which comprises using a sputtering method comprising sputtering a target at a temperature of a substrate of lower than 300° C., to deposit on the substrate a film of a metal oxide which is capable of having a fluorite-type structure of an orthorhombic crystal phase (or an orthorhombic crystal phase of a fluorite-type structure), and having a subsequent thermal history of said film of lower than 300° C., or applying an electric field to said film after said deposition or after said thermal history of lower than 300° C., whereby a ferroelectric film comprising a crystalline metal oxide having a fluorite-type structure of an orthorhombic crystal phase is produced.

Conventionally, when forming a ferroelectric film comprising a metal oxide having a fluorite-type structure of an orthorhombic crystal phase by the method of PLD, etc., the ferroelectric film is obtained by depositing at a high temperature of 300° C. or higher, or by annealing at a high temperature of 300° C. or higher after metal oxide film deposition. By deposition at room temperature or below 300° C., a monoclinic crystal phase is obtained. However, the present inventors have discovered that surprisingly, a ferroelectric film comprising a crystalline metal oxide having a fluorite-type structure of an orthorhombic crystal phase can be formed, when deposition is carried out by the sputtering method at a temperature of a substrate of lower than 300° C. using a target with a raw material composition capable of having a fluorite-type structure of an orthorhombic crystal phase, without post-annealing at a high temperature of 300° C. or higher, or when an electric field is applied to the film after the deposition or the thermal history.

(Ferroelectric Film)

In the production method of a ferroelectric film of the present invention, the formed ferroelectric film is a ferroelectric film comprising a crystalline metal oxide having a fluorite-type structure of an orthorhombic crystal phase.

Figure 1:
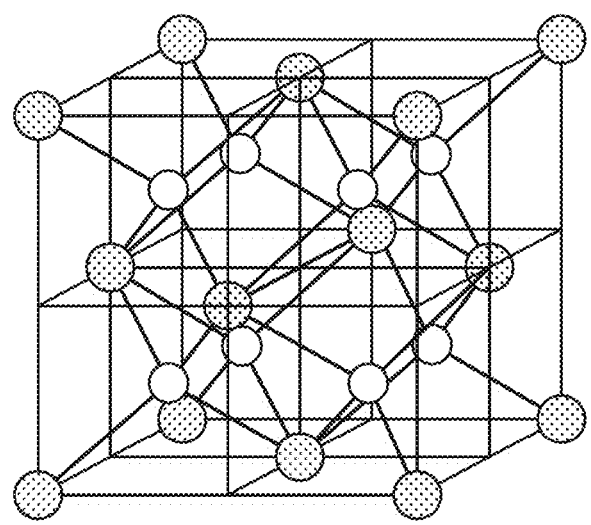
FIG. 1 is a schematic perspective view showing a fluorite-type structure unit cell.

The fluorite-type structure and the orthorhombic crystal phase are widely known in crystallography. FIG. 1 shows a unit cell of a fluorite-type structure. Crystals with a fluorite-type structure can have a total of four crystal structures, including cubic, tetragonal, orthorhombic, and monoclinic crystals, and though cubic, tetragonal, and orthorhombic crystals have intersecting crystal axes in the vertical directions and have a right-angled quadrangular surface lattice, cubic crystals have the same length on all three axes, tetragonal crystals have the same length on two axes and a different length on one axis, and orthorhombic crystals have different lengths on all three axes. Conversely, in monoclinic crystals, two of the crystal axes do not intersect in the vertical direction, and the lengths of all three axes are different. The ferroelectric film of the present invention has a ferroelectric structure of an orthorhombic crystal phase. In the absence of an orthorhombic crystal phase, the ferroelectric film cannot be obtained. Conventionally, the formation of a ferroelectric film of a metal oxide having a fluorite-type structure of an orthorhombic crystal phase on a substrate at a temperature of lower than 300° C. without post-annealing has not been reported.

The presence of a fluorite-type structure of an orthorhombic crystal phase in the ferroelectric film of the present invention may be confirmed by X-ray diffraction (the presence of superlattice reflection in wide area reciprocal lattice mapping measurement). However, though the ferroelectric film of the present invention can be easily confirmed to be orthorhombic crystal phase and/or tetragonal crystal phase, identification between the orthorhombic crystal phase and tetragonal crystal phase cannot be done, depending on the type of the metal oxide, due to the difference in the length of axis of orthorhombic crystal phase and/or tetragonal crystal phase being small, depending on the type and accuracy of X-ray diffraction apparatus. In such a case, presence of orthorhombic crystal phase may be confirmed by analyzing polarization hysteresis characteristics to determine whether or not ferroelectricity is shown. When polarization hysteresis characteristics are confirmed as a result of the polarization hysteresis measurement, since an electric field is applied for the polarization hysteresis measurement, a film prior to the measurement may already have an orthorhombic crystal phase or a film may have a tetragonal crystal phase prior to the measurement and then have an orthorhombic crystal phase due to electric field-induced phase transition by electric field application. In the present invention, either case is acceptable as long as, as a result, the film exhibits ferroelectricity and has an orthorhombic crystal phase. The ferroelectric film of the present invention may further exhibit ferroelectricity by inducing a phase change in the orthorhombic crystal phase by the application of an electric field even when it can be confirmed that the film after film formation is tetragonal. Those exhibiting ferroelectricity have an orthorhombic crystal phase and are encompassed by the ferroelectric film of the present invention.

If it is not possible to distinguish between the orthorhombic crystal phase and the tetragonal crystal phase depending on the type of X-ray diffractometer and measurement accuracy, the crystal phase may be analyzed by an X-ray diffraction method with higher analysis accuracy (for example, SPring 8). In addition thereto, by investigating the polarization characteristics (hysteresis characteristics) while gradually increasing the applied electric field and then gradually decreasing the applied electric field, and investigating changes in polarization characteristics (hysteresis characteristics, in particular, residual polarization value and coercive electric field value) during that period, after film formation, it may be possible to confirm that the film has an orthorhombic crystal phase before measuring the hysteresis characteristics. The change in the polarization characteristic value that appears may differ between the case of an orthorhombic crystal phase before electric field application (in particular, an oriented film) and the case in which the phase change is induced by the electric field application. In the former (in particular, an oriented film), the applied electric field for obtaining the remanent polarization value may be low, whereas in the latter, the applied electric field for obtaining the remnant polarization value may be high (it is necessary to induce an electric field from the tetragonal crystal to the orthorhombic crystal phase). In films which have an orthorhombic crystal phase since before the electric field application (hysteresis characteristic measurement), when the applied electric field is increased and when it is decreased, the applied electric fields exhibiting the same residual polarization value and coercive electric field value are the same or do not change significantly, whereas in films which were previously tetragonal before the electric field application (hysteresis characteristic measurement), the applied electric fields exhibiting the same residual polarization value and coercive electric field value is high when the applied electric field is increased and low when the applied electric field is decreased, and a significant difference may be observed therebetween (refer to the Examples and FIG. 32). However, in films which had an orthorhombic crystal phase prior to electric field application (hysteresis characteristic measurement), which are films with low orientation, since an applied electric field is required for orientation (polarization), and polarization hysteresis characteristics may not be exhibited at low applied electric fields, even if it cannot be confirmed that the film has an orthorhombic crystal phase by this measurement method, it is possible that the film after film formation will have an orthorhombic crystal phase.

The film of the present invention has a fluorite-type structure of an orthorhombic crystal phase and exhibits ferroelectricity, and the ferroelectricity can be confirmed by polarization hysteresis measurement (polarization-electric field relationship). The polarization hysteresis measurement (polarization-electric field relationship) method is known. A film exhibiting ferroelectricity always exhibits piezoelectricity, and the piezoelectricity can also be confirmed by applying a voltage to a test sample and observing expansion and contraction.

The film of the present invention is a ferroelectric film having a crystal having a fluorite-type structure of an orthorhombic crystal phase and comprising a metal oxide exhibiting ferroelectricity. As such a metal oxide, a metal oxide comprising one of hafnium (Hf) oxide, zirconium (Zr) oxide, and cerium (Ce) oxide, or a metal oxide solid solution comprising two or more of those metal oxides, or a metal oxide comprising one or more metal of hafnium (Hf), zirconium (Zr) and cerium (Ce) and an addition or substitution element such as aluminum (Al), silicon (Si), strontium (Sr), barium (Ba), a rare earth element (Sc, Y, La, Ce, Pr, Nd, Sm, Eu, Gd, Tb, Dy, Ho, Er, Tm, Yb, and Lu) or the like, is preferable. As a metal oxide that can have a fluorite-type structure and can exhibit an orthorhombic crystal and ferroelectricity, metal oxides comprising one or more of hafnium (Hf), zirconium (Zr), and cerium (Ce), or those metal oxides which further comprise the above-mentioned addition or substitution elements are known. Also, metal oxides comprising any of the three kinds of metals, particularly Hf and Zr, are known to be metal oxides which can be completely dissolved in each other and which have a high crystal structure similarity. (Refer to, for example, J. Amer. Ceram Soc., 37 (10) 458 (1954))

Though these metal oxides comprising one or more of Hf, Zr, and Ce are metal oxides similar to each other, and can form solid solutions with each other, it is also known that by including oxygen defects, these oxides can have a fluorite-type structure of an orthorhombic crystal phase and exhibit ferroelectricity.

As the metal oxide, preferably, a metal oxide comprising one or more metals of Hf, Zr, and Ce with addition or substitution of an element can be used. Examples of elements that can be used as the element for substitution or addition (hereinafter, also simply referred to as substitution element) include any element which dissolves in the metal oxides described above, for example, aluminum (Al), silicon (Si), strontium (Sr), and barium (Ba), and rare earth elements (Sc, Y, La, Ce, Pr, Nd, Sm, Eu, Gd, Tb, Dy, Ho, Er, Tm, Yb, Lu).

The amount of these substitution elements depends on the type of metal oxide and substitution element for replacement, but may be the amount that forms the fluorite-type structure of an orthorhombic crystal phase, and in general, the molar number of the substitution element (metal element) is 15 mol % or less, preferably 0.1 to 10%, and may be 4 to 9 mol %, assuming that the total of the metals of the entire metal oxide substituted with the element is 100 mol %. If the amount of the substitution element is less than the foregoing, a fluorite-type structure having a monoclinic crystal phase may stabilize. If the amount of element substitution is larger than the foregoing, a fluorite-type structure having a tetragonal crystal phase or a cubic crystal phase may stabilize.

The metal oxide to be element-substituted in the foregoing may be a simple oxide such as a hafnium oxide, a zirconium oxide, or a cerium oxide, or a solid solution of these metal oxides as long as it has a fluorite-type structure. In the case of a solid solution of metal oxides, the ferroelectric film having a fluorite-type structure of an orthorhombic crystal phase of the present invention can be obtained by substituting the solid solution of the metal oxides with aluminum, silicon, a rare earth element or the like. The amount of the element substitution is 15 mol % or less, preferably 0.1 to 10%, more preferably 4 to 9 mol %, with the total amount of metals in the solid solution of the element-substituted metal oxides being 100 mol % as described above.

In a preferred aspect, a metal oxide containing at least one of hafnium (Hf) and zirconium (Zr), and containing a substitution element such as aluminum (Al), silicon (Si), strontium (Sr), barium (Ba), or a rare earth element, is preferably used. Though hafnium (Hf) oxide and zirconium (Zr) oxide can be completely dissolved in each other, in the case of zirconium (Zr) oxide alone, the molar number of the substitution element (metal element) is 0.5 to 5 mol %, 1 to 3 mol or 1 to 2 mol %, when the total of the metals of the entire metal oxide substituted with the element is 100 mol %, is preferable. In the case of hafnium (Hf) oxide alone, the molar number of the substitution element (metal element) is 3 to 12 mol %, 4 to 9% or 4 to 8 mol %, when the total of the metals of the metal oxide substituted with the element is 100 mol %, is particularly preferable. In a solid solution of hafnium (Hf) oxide and zirconium (Zr) oxide, based on the above amounts (ranges) of the substitution element in the cases of hafnium (Hf) oxide alone and zirconium (Zr) oxide alone, it is preferable that the substitution amounts (ranges) be weighted and added according to the solid solution ratio of Hf and Zr. Within these ranges, a ferroelectric film having a fluorite-type structure of an orthorhombic crystal phase can be more easily produced by the sputtering method. When the molar ratio of Zr and Hf is $r=Zr/(Zr+Hf)$, a molar number range of $[0.5+(3-0.5)r]$ to $[5+(12-5)r]$, and $[1+(4-1)r]$ to $[3+(9-3)r]$, or $[1+(4-1)r]$ to $[2+(8-2)r]$ is preferable when the total of Zr and Hf is 100 mol %.

The ferroelectric film of the present invention must have a fluorite-type structure of an orthorhombic crystal phase and exhibit ferroelectricity. Though ferroelectricity is also considered to be the result of the presence of a fluorite-type structure of an orthorhombic crystal phase, the ferroelectric film of the present invention not only has a fluorite-type structure of an orthorhombic crystal phase, but also exhibits ferroelectricity.

The ferroelectric film produced by the production method of the present invention is a crystal having a fluorite-type structure an orthorhombic crystal phase and which exhibits ferroelectricity, but in addition to polycrystals, it may be uniaxially oriented crystals, and further may be epitaxial crystals. In the case in which another crystal film grows on a crystal substrate, a crystal grown in which one crystal axis of the crystal is substantially aligned with one crystal axis of the crystal substrate is referred to as a uniaxially oriented crystal, and a crystal grown in which the two crystal axes of the crystal are substantially aligned with two crystal axes of the crystal substrate is referred to as an epitaxial crystal. It is also possible to form a uniaxially oriented crystal in which "local epitaxial growth" is epitaxially grown for each crystal grain, or a single crystalline epitaxial crystal in which the epitaxially grown crystal grains have a substantial size. "Uniaxially oriented crystal" originally refers to the orientation of the crystals in relation to the crystal substrate, and based on the specific crystal orientation of the obtained uniaxially oriented crystals, the crystal orientation of the crystal film alone separated from the crystal substrate may also be referred to as uniaxially oriented.

The film thickness of the ferroelectric film produced by the production method of the present invention is not particularly limited because a suitable film thickness is adopted according to the final use of the ferroelectric film, and the film thickness may be, for example, 1 nm or more, 20 nm or more, 100 nm or more, and in particular, in the case of a piezoelectric material, it may be 300 nm or more, 500 nm or more, and 1 μm or more. Further, it may be 5 nm or more and 10 nm or more. Further, the upper limit is not limited, and may be, for example, 10 μm or less, 5 μm or less, 3 μm or less, and 1 μm or less. In a preferred aspect, the film thickness of the ferroelectric film is 5 nm to 1000 nm, more preferably 10 nm to 500 nm. In yet another preferred aspect, the film thickness of the ferroelectric film is 500 nm to 5 μm, more preferably 1 μm to 3 μm.

(Sputtering Method)

The present invention is characterized by the use of the sputtering method. In addition to the sputtering method. When other film forming methods (deposition methods) such as the sol-gel method, the CVD (Chemical Vapor Deposition) method, the PLD (Pulsed Laser Deposition) method, and the ALD (Atomic Layer Deposition) method are used, excluding the hydrothermal method, even if a metal oxide film having a fluorite-type structure is deposited, unless the substrate temperature is 300° C. or higher, or the film is annealed at a temperature of 300° C. or higher after deposition, a fluorite-type structure of an orthorhombic crystal phase or even a tetragonal crystal phase cannot be obtained, resulting in a film which does not exhibit ferroelectricity. The present inventors have discovered that unlike conventional findings, quite unexpectedly, by using the sputtering method, even if the substrate temperature is lower than 300° C., it is possible to form a metal oxide film having a fluorite-type structure of an orthorhombic crystal phase and exhibiting ferroelectricity without the need for high temperature annealing after deposition. According to the production method of the present invention, even when deposition is carried out at a substrate temperature of lower than 300° C. and the subsequent thermal history is lower than 300° C., in some cases by applying an electric field, a ferroelectric film comprising a crystalline metal oxide having a fluorite-type structure of an orthorhombic crystal phase can be produced, which is a novel technology not present in the prior art.

The sputtering method is a deposition method in which a material such as a metal oxide(s) or a metal(s), which is the raw material of a metal oxide of the film to be deposited, is installed as a target in a vacuum chamber, and particles such as ions and electrons, for example, a gas ionized by applying a high voltage, for example, nitrogen gas or noble gas (typically argon), is collided with the target, whereby the film material on the target surface is ejected with high energy, and the ejected material with high energy reaches the substrate to form a film. The vapor phase depositions include methods in which the raw material is vaporized mainly by using heat, such as the evaporation method in which the film raw material is heated and evaporated, and the pulse laser deposition method (PLD) in which the film raw material is irradiated with a pulse laser beam to evaporate the film raw material. For films having a stable monoclinic crystal phase at low temperatures, unless a sputtering method, in which accelerated particles with high energy collide with the target, is used, the effect of the present invention (a ferroelectric film comprising a metal oxide of crystal having orthorhombic crystal phase or tetragonal fluorite-type structure at low temperature) cannot be obtained. In the evaporation method and PLD method, heat is used instead of colliding the target with particles to vaporize the raw material, so the energy at the time of deposition is low, and it is considered that a ferroelectric film, which is the object of the present invention, cannot be formed.

Figure 2:
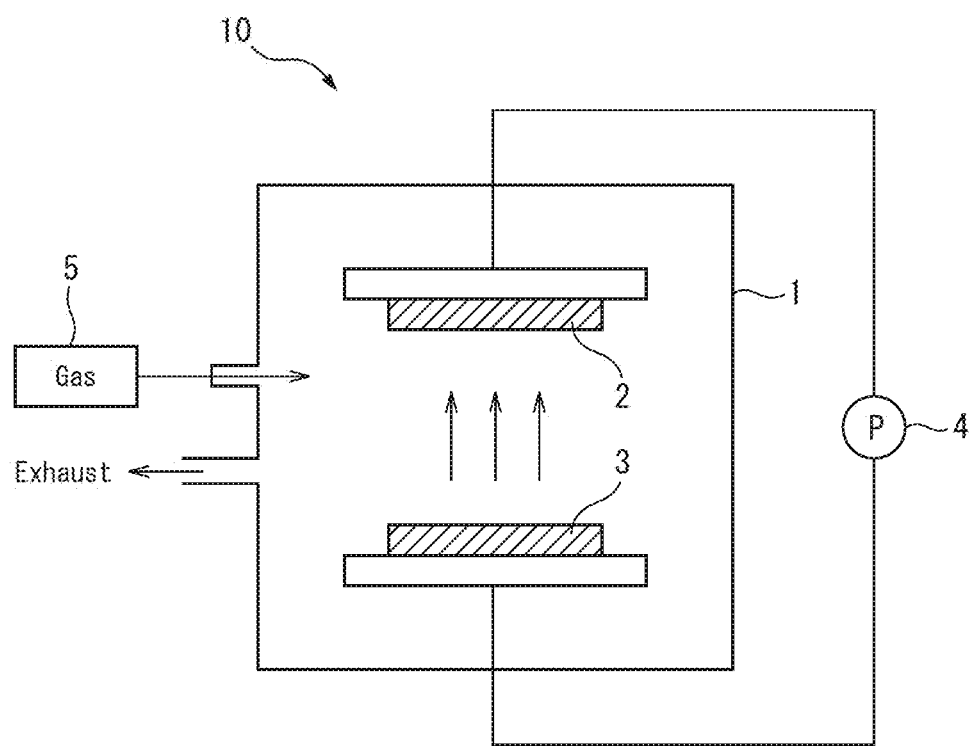
FIG. 2 is a schematic view of an example of a sputtering device.

FIG. 2 schematically shows a typical example of a sputtering device 10. The sputtering device 10 comprises a vacuum chamber 1, a substrate 2 and a target 3 arranged in the vacuum chamber 1, a power supply 4 for applying voltage between the substrate 2 and the target 3, an atmospheric gas introduction system 5 in the vacuum chamber 1, a heater (not illustrated) for heating the substrate 3, and a thermometer (not illustrated) for measuring the temperature of substrate 2. The sputtering device 10 may optionally comprise a magnetron generator at the target 3 to form a magnetron sputtering device. Conventionally, a high DC or AC voltage is applied between the substrate 2 and the target 3 to ionize the inert gas in the vacuum chamber 1, and the substrate 2 is biased to a potential higher than the target 3, whereby the inert gas ions collide with the target and eject the raw material on the surface of the target, and the ejected raw material reaches the substrate to deposit the target material on the substrate surface in a high energy state as compared with thermal evaporation methods. The sputtering method of the present invention includes a reactive sputtering method for forming a film of a reaction product produced by a chemical reaction between a raw material sputtered from a target and a gas. Even in the reactive sputtering method, the raw material that is ejected out of the target with high energy is deposited on the substrate with high energy even if it chemically reacts with the gas in the atmosphere, whereby a ferroelectric film comprising a metallic oxide of a crystal having a fluorite-type structure of an orthorhombic crystal phase or tetragonal crystal phase, which are not stable at low temperatures, can be obtained. In the case of the sputtering method in the narrow sense (non-reactive sputtering method) that does not involve a chemical reaction, the inert atmosphere is used, and the atmosphere does not contain a gas that is reactive with the raw material. However, a small amount of oxygen gas can be included in the atmospheric gas to stabilize the composition of the metal oxide to be formed.

The conditions of the sputtering method described above may be used for the sputtering method used in the production method of the ferroelectric film of the present invention. The sputtering method used in the present invention may be any method as long as it is a method of sputtering a target using particles such as ions and electrons instead of heat, and examples thereof include the ion beam sputtering method and the electron beam sputtering method in addition to the conventional sputtering method in which an electric field is applied to generate plasma. As long as it is a sputtering method, any of a DC sputtering method, an AC sputtering method, an RF sputtering method, a magnetron sputtering method, an AC magnetron sputtering method, an ion beam sputtering method, and an ECR sputtering method may be used. Preferred aspects of the sputtering method include the DC sputtering method and the AC magnetron sputtering method.

(Target)

As described above, the film formed in the present invention comprises a metal oxide having a fluorite-type structure of an orthorhombic crystal phase and exhibits ferroelectricity. The target used in the present invention is a metal oxide and/or a metal capable of forming such a metal oxide (having a fluorite-type structure of an orthorhombic crystal phase and exhibiting ferroelectricity). In non-reactive sputtering methods, the target is preferably a metal oxide itself having the same composition as the metal oxides described above, and may be composed of a combination of a plurality of metal oxides, and the average composition thereof may be the same as that of the metal oxides described above. In the case of reactive sputtering methods, a metal can be used as the target, whereas in non-reactive sputtering methods, a metal may be used as a part of the target. The metal oxide for film production by the sputtering method basically has the same composition as the target, but the composition of the film sputtered and ejected from the target and is deposited on the substrate may be slightly changed from the composition (average composition) of the target metal oxide. In the sputtering method of the present invention, the change in the composition of the target substance between the target and the obtained film is generally slight and negligible. The number of moles of each metal element and oxygen is considered to be 2 to 3% or less, usually 1% or less, 0.5% or less, and further 0.02% or less.

In the production method of a ferroelectric film of the present invention, as the metal oxide constituting the target, for example, a metal oxide such as a hafnium oxide, a zirconium oxide, a cerium oxide, and a solid solution thereof or a material of these metal oxides substituted with element(s) can preferably be used. Examples of elements which can be used as a substitution element include any element that dissolves in the metal oxides described above, for example, aluminum (Al), silicon (Si), strontium (Sr), barium (Ba) and rare earth elements (Sc, Y, La, Ce, Pr, Nd, Sm, Eu, Gd, Tb, Dy, Ho, Er, Tm, Yb, and Lu). In non-reactive sputtering methods, the target is preferably a metal oxide itself having such a composition, but may be a complex of a plurality of metal oxides whose average composition matches the composition of the metal oxide described above. In particular, the substitution element is a metal oxide alone or integrated with another metal oxide, or may be a metal.

(Sputtering Conditions)

In the production method of a ferroelectric film of the present invention, the substrate temperature at the time of sputtering is lower than 300° C. The substrate may be at room temperature without heating, but if it is heated below 300° C., the benefit of lowering the temperature can be obtained as compared with the conventional method of forming a film or annealing at a temperature of 300° C. or higher. One preferred aspect is room temperature (e.g., 25° C.). Another preferred aspect is heating to a temperature of lower than 300° C., for example, heating to a temperature of 50° C. or higher, 100° C. or higher, and lower than 300° C., 250° C. or lower, or 150° C. or lower. It is preferable that the temperature be lower in order to avoid the harmful effects of the heat treatment, but it may be desirable to raise the temperature to a certain level in order to improve the crystallinity of the film to be formed.

In the production method of a ferroelectric film of the present invention, in non-reactive sputtering, the atmosphere in the vacuum chamber is an inert atmosphere that does not react with the target material (raw material) ejected from the target, for example, noble gases such as argon, xenon, krypton, and helium, as well as nitrogen, and is more preferably a noble gas, in particular argon. Since the target and produced film are metal oxides, a small amount of oxygen may be included to stabilize the composition of the metal oxide. The content of oxygen gas contained in the inert atmosphere may be 10% or less, 5% or less, 1% or less, 0.1% or less in terms of partial pressure in the atmosphere. However, in one aspect of the present invention, it is most preferably composed of only an inert gas atmosphere and no oxygen gas is present in the atmosphere. In non-reactive sputtering, if oxygen gas is contained in the atmosphere, the partial pressure of the oxygen gas in the inert gas is preferably less than 1%, 0.05% or less, and 0.01% or less.

In reactive sputtering, the atmosphere in the vacuum chamber is an oxygen-containing atmosphere. In addition to oxygen, the above-mentioned inert gas, for example, a noble gas such as argon, xenon, krypton, or helium, or nitrogen, preferably a noble gas, in particular argon, can be contained therein. The ratio of the inert gas to oxygen is not limited, and may be, as a molar ratio, 100:0 to 100:1, further 100:0 to 100:0.5, 100:0 to 100:0.1, or 100:0 to 100:0.01.

In the production method of a ferroelectric film of the present invention, the atmospheric pressure in the vacuum chamber is reduced. The pressure may be, for example, 10 to 200 mTorr.

In the production method of a ferroelectric film of the present invention, the electric field applied between the substrate and the target may be, for example, DC or RF. The electric field for ionizing the atmospheric gas such as argon may be direct current or high frequency, etc.

In the production method of a ferroelectric film of the present invention, the sputtering power may be, for example, 0.06 to 2.47 W/cm$^2$, further 0.12 to 1.85 W/cm$^2$, 0.12 to 1.23 W/cm$^2$, or 0.12 to 0.617 W/cm$^2$ based on the surface area of the target. The higher the sputtering power, the higher the efficiency of film formation (the film thickness per unit time can be increased), but the crystallinity of the obtained film may possibly decrease.

In the production method of a ferroelectric film of the present invention, the sputtering time is not unconditional because it depends on the film formation speed and the desired film thickness, but may be, for example, 1 min to 300 min.

(Thermal History after Deposition)

In the production method of the present invention, since the ferroelectric film can be obtained by sputtering at a substrate temperature of lower than 300° C., the thermal history after deposition may be lower than 300° C. When the thermal history at the time of deposition and after deposition is lower than 300° C., the ferroelectric film of the metal oxide of the present invention can be deposited on a substrate having a heat resistance of lower than 300° C. without damaging the substrate. In a preferred aspect, no annealing is required after sputtering, and in another preferred aspect, after sputtering, annealing may be performed at a temperature of lower than 300° C., for example, a temperature of 50° C. or higher and 100° C. or higher, and a temperature of lower than 300° C., 250° C. or lower, or 150° C. or lower.

(Electric Field Application after Deposition)

In the production method of one aspect of the present invention, after a metal oxide film capable of having a fluorite-type structure of an orthorhombic crystal phase is deposited by sputtering at a substrate temperature of lower than 300° C., and a thermal history after the deposition is lower than 300° C., an electric field is further applied at after the deposition or after the thermal history, a ferroelectric film comprising a crystalline metal oxide having a fluorite-type structure of an orthorhombic crystal phase may be obtained. In this aspect, the film after deposition is tetragonal crystal phase and the electric field application induces a phase change from the tetragonal crystal phase to an orthorhombic crystal phase.

If the sputtering method is not used, in the case of low temperature film deposition and low temperature thermal history at a temperature of lower than 300° C., a fluorite-structured metal oxide film which can induce a phase change from the tetragonal crystal phase to the orthorhombic crystal phase (which is not a stable phase at low temperatures) by electric field application cannot be obtained.

The electric field application depends on the crystal structure, crystal state, and film thickness of the film, and is not unconditional, but in general, 1 MV/cm or more, 3 MV/cm or more, 4 MV/cm or more, or 5 MV/cm or more is preferable. Further, it may be 3 MV/cm or less. The applied electric field is preferably alternating current, the frequency may be 1 to 100 kHz, and the application time (number of cycles) may be 1 cycle or more.

The electric field application may be carried out at room temperature, but may be carried out under a temperature rise of lower than 300° C., particularly a temperature not higher than either the deposition temperature or the annealing temperature after deposition.

Depending on the film, the aspect and conditions of the electric field application may be the same as those used for hysteresis analysis or polarization treatment of the ferroelectric, or the energy condition may be higher than the conditions used for the hysteresis analysis or polarization treatment, or may be lower than the conditions used for the hysteresis analysis or polarization treatment.

The ferroelectric film produced in the present invention is preferably polarized (polarization treatment) when used as a ferroelectric element or a ferroelectric functional element.

In one aspect, this polarization treatment may be an electric field application treatment that induces a phase change from a tetragonal crystal to an orthorhombic crystal phase.

(Substrate)

In the production method of a ferroelectric film of the present invention, the substrate on which the ferroelectric film is deposited is not particularly limited, and any substrate conventionally used as a film-forming substrate for a ferroelectric film similar to the ferroelectric film of the present invention can be used. For example, ceramic, semiconductor, metal, or organic substrates can be used. The ceramic may be conductive or insulating.

In the production method of the present invention, since the substrate is used to enhance the crystallinity of the ferroelectric film to be formed, a crystalline substrate having a small crystal lattice mismatch with the ferroelectric film is preferably used. Preferred crystal substrates include, for example, crystal substrates having a cubic fluorite-type structure, a bixbyite structure, a pyrochlore structure, a diamond structure, a zinc sphalerite structure, or a perovskite structure.

Examples of crystalline substrates with a cubic fluorite-type structure include yttria-stabilized zirconia (lattice constant a=approximately 5.15 angstrom), cerium oxides (lattice constant a=approximately 5.41 angstrom), and calcium fluorides (lattice constant a=approximately 5.466 angstrom).

Examples of crystal substrates having a bixbyite structure include indium oxides (lattice constant a=approximately 10.125 angstrom), indium-tin oxides (lattice constant a=approximately 10.125 angstrom), scandium oxides (lattice constant a=approximately 9.845 angstrom), yttrium oxides (lattice constant a=approximately 10.604 angstrom), erbium oxide (lattice constant a=approximately 10.545 angstrom), thulium oxides (lattice constant a=approximately 10.49 angstrom), ytterbium oxides (lattice constant a=approximately 10.434 angstrom), and lutetium oxide (lattice constant a=approximately 10.363 angstrom). The lattice constants of the ferroelectric of an orthorhombic fluorite-type structure and the crystal substrate may have a multiplicative relationship.

Examples of crystal substrates having a pyrochlore structure include $Bi_2Ru_2O_7$ (lattice constant a=approximately 10.293 angstrom), rare earth ruthenium oxide $R_2Ru_2O_7$ (R is a rare earth element), $Bi_2Ir_2O_7$ (lattice constant a=approximately 10.323 angstrom), and rare earth iridium oxide $R_2Ir_2O_7$, wherein R is a rare earth element.

Some semiconductors can be used as a crystalline substrate. Particularly if the lattice constant is suitable, it can suitably be used. Examples of semiconductors having a diamond structure include silicon (lattice constant a=about 5.43 angstrom) and germanium (lattice constant a=about 5.6575 angstrom). Examples of compound semiconductors having a zinc flash structure include Group III-V compound semiconductors such as gallium arsenide (lattice constant a=about 5.6532 angstrom), aluminum arsenic (lattice constant a=about 5.656 angstrom), gallium phosphide (lattice constant a=about 5.450 angstrom), aluminum phosphide (lattice constant a=about 5.451 angstrom), as well as II-IV compound semiconductors such as zinc beta sulfide (lattice constant a=about 5.4109 angstrom) and zinc selenide (lattice constant a=about 5.451 angstrom).

In the ferroelectric film of the present invention, the above-mentioned crystalline substrate can be a film formed on a substrate such as an yttria-stabilized zirconia substrate or a single crystal silicon substrate.

The crystalline substrate described above may be formed on a semiconductor, in particular, a single crystal silicon substrate, and a cubic fluorite-type or bixbyite-type epitaxial crystal film may be further provided as a buffer layer between the crystal substrate and the semiconductor substrate such as a single crystal silicon substrate.

The crystal substrate forming the ferroelectric epitaxial film of the present invention can be an electrode layer having conductivity. Examples of crystal substrates capable of forming the ferroelectric film of the present invention and having conductivity include pyrochlore structures such as $Bi_2Ru_2O_7$, $R_2Ru_2O_7$ (R is a rare earth element), $Bi_2Ir_2O_7$, and rare earth iridium oxide $R_2Ir_2O_7$ (R is a rare earth element). Indium tin oxide (ITO) is also conductive, and the ferroelectric film of the present invention can be formed on the conductive film. The conductive crystal substrate such as these conductive pyrochlore structures or ITO can be formed on a substrate such as an yttria-stabilized zirconia substrate or a single crystal silicon substrate.

In particular, as the structure for forming the ferroelectric film of the present invention on a semiconductor substrate such as silicon, when the semiconductor is represented by S, the ferroelectric epitaxial film is represented by F, the metal is represented by M, and the insulator is represented by I, structures such as MFS structures (e.g., M/F/Si), MFIS structures (e.g., M/F/fluorite-type structure/Si and M/F/bixbyite structure/Si), MFM(IS) structures (e.g., M/F/ITO/(fluorite-type structure or bixbyite structure)/Si, and M/F/conductive pyrochlore structure/(fluorite-type structure or bixbyite structure)/Si) can be used. The portion described herein as "(fluorite-type structure or bixbyite structure)" is a buffer layer and can be omitted. FIG. 3 shows, as examples of ferroelectric elements or ferroelectric functional elements in which the ferroelectric film is used, examples of laminate structures including ferroelectric films as described above in a memory, resistance change memory, transistor, capacitor, cooling device, and pyroelectric device. Ferroelectric elements generally include a ferroelectric film and a pair of electrodes, each of which is in direct or indirect contact with each of both sides of the ferroelectric film and is electrically connected to the ferroelectric film.

Examples of semiconductors include semiconductors with a diamond structure, such as diamond (lattice constant a=about 3.567 angstrom), silicon (lattice constant a=about 5.43 angstrom) and germanium (lattice constant a=about 5.6575 angstrom); sphalerite-type compound semiconductors such as beta silicon carbide (lattice constant a=about 4.3596 angstrom); group III-V compound semiconductors such as gallium arsenide (lattice constant a=about 5.6532 angstrom), aluminum arsenic (lattice constant a=about 5.656 angstrom), gallium phosphide (lattice constant a=about 5.450 angstrom) and aluminum phosphide (lattice constant a=about 5.451 angstrom); and group II-IV compound semiconductors such as zinc beta sulfide (lattice constant a=about 5.4109 angstrom) and zinc selenide (lattice constant a=about 5.451 angstrom).

In the production method of the present invention, a substrate having a heat resistant temperature of lower than 300° C. can be preferably formed from the viewpoint of effectively utilizing the advantage that the ferroelectric film can be formed at a low temperature of lower than 300° C. Examples of substrates having a heat resistant temperature of lower than 300° C. include organic resins, in particular organic resins having a glass transition temperature of lower than 300° C., inorganic glasses having a glass transition temperature of lower than 300° C., such as soda glass, and metals having a softening temperature of lower than 300° C., such as an aluminum wiring layer, copper foil, and gold leaf. It is preferable to form the ferroelectric film on one of these low heat-resistance substrates by the low-temperature deposition method of the present invention because the ferroelectric film can be formed on the low heat resistant substrate without damaging the substrate. Since organic resin substrates having a glass transition temperature of lower than 300° C. can have flexibility, a flexible ferroelectric film can be obtained, and new and unique uses are expected therefrom.

In a preferred aspect of the present invention, the substrate may be a semiconductor or an insulator as well as a conductive substrate such as metal. According to the production method of the present invention, a ferroelectric film can be formed on substrates composed of various materials.

In a preferred aspect of the present invention, a conductive film may be provided between the substrate and the ferroelectric film. Conductive films are preferable because they can function as an electrode layer for the ferroelectric film. Examples of such conductive films include ITO (indium tin oxide), metals such as platinum Pt, Ir, Al, and Ag, and conductive ceramics such as TiN, $IrO_2$, $RuO_2$, $SrRuO_3$, $LaNiO_3$, and $LaSrCoO_3$.

The film thickness of the conductive film is also not limited, but may be, for example, preferably 1 nm to 100 nm, more preferably 10 nm to 100 nm. The substrate having the conductive film at this time is not particularly limited, and may be a substrate having a low heat resistance of lower than 300° C. as described above. When a conductive film is provided between the substrate and the ferroelectric film, the substrate having the conductive film on the surface thereof as a whole can be considered as the substrate (composite substrate) of the film formation method of the present invention.

In a preferred aspect of the present invention, in addition to a conductive substrate such as a metal, a semiconductor film or an insulator may be provided between the substrate and the ferroelectric film. A substrate having such a film on the surface thereof as a whole can also be considered as the substrate (composite substrate) of the film formation method of the present invention.

(Ferroelectric Film-2)

A second aspect of the present invention provides a ferroelectric film produced by the production method of the first aspect. This ferroelectric film is a ferroelectric film comprising a crystalline metal oxide having a fluorite-type structure of an orthorhombic crystal phase, and is the film described above as the ferroelectric film to be formed. The fluorite-type structure, orthorhombic crystal phase, crystallinity, and ferroelectric film have been also described.

The metal oxide of the ferroelectric film is a metal oxide formed on a substrate by the above production method. This metal oxide is a ferroelectric film of crystal having a fluorite-type structure of an orthorhombic crystal phase. In non-reactive sputtering methods, the metal oxide may match the composition of the metal oxide used as the target or the average composition of the combination of the metal oxides in the production method described above. In the production method of a ferroelectric film of the present invention, the composition of the obtained film basically matches the composition of the target. However, the metal oxide need not be exactly the same as the composition of the metal oxide used as the target or the average composition of the combination of metal oxides in the production method described above. The composition of the film obtained at the time of sputtering may change slightly from the composition of the target, as long as the obtained film is a ferroelectric film of crystalline metal oxide having a fluorite-type structure of an orthorhombic crystal phase.

In a preferred aspect of the present invention, the metal oxide of the ferroelectric film to be obtained is the metal oxide described above.

In a preferred aspect of the present invention, the ferroelectric film is obtained on a substrate, and the substrate is not particularly limited. Examples of preferable substrates include the low heat-resistant substrates having a heat resistance of lower than 300° C. described above, such as organic resins, in particular, organic resins having a glass transition temperature of lower than 300° C., inorganic glasses having a low heat resistance or inorganic glass having a glass transition temperature of lower than 300° C., such as soda glass, and metals having low heat resistance or metals having a softening temperature of lower than 300° C., such as an aluminum wiring layer, copper foil, or gold leaf. The substrate may be inside a semiconductor device. If the ferroelectric film can be formed inside a semiconductor device at a low temperature, it is preferable because it does not affect members or elements (for example, impurity diffusion region and aluminum wiring) which are vulnerable to the high temperature of the semiconductor device.

In a preferred aspect of the present invention, a conductive film capable of functioning as an electrode layer may be provided between the substrate and the ferroelectric film. Examples of such a conductive film include ITO (indium tin oxide), aluminum, and silver. The film thickness of the conductive film is also not limited, and may be, for example, preferably 1 nm to 100 nm, and more preferably 10 nm to 100 nm. When a conductive film is provided between the substrate and the ferroelectric film, this conductive film may be considered as a substrate, or the substrate having a conductive film on the surface thereof as a whole can be considered as a substrate (composite substrate) in the film formation method of the present invention.

In a preferred aspect of the present invention, in addition to conductive substrates such as metals, a semiconductor film or an insulator may be provided between the substrate and the ferroelectric film. The film between the substrate and the ferroelectric film is preferably a film deposited by the sputtering method, the PLD method, or the CVD method. A substrate having such a film on the surface thereof as a whole can also be considered as the substrate (composite substrate) in the film formation method of the present invention.

The ferroelectric film of the present invention can have an electrode layer on the film. The electrode layer on the ferroelectric film may be conductive, and examples thereof include ITO, Pt, and Ir.

In a preferred aspect of the present invention, the ferroelectric film may be in the interior of any of various ferroelectric functional elements or devices such as memories, transistors, capacitors, piezoelectric elements, cooling devices, and pyroelectric devices.

(Ferroelectric Elements, Ferroelectric Functional Elements or Devices)

The ferroelectric film provided by the present invention can be applied to various ferroelectric elements and ferroelectric functional elements or devices such as capacitors, electro-optical elements, memory elements, transistors, piezoelectric materials, and pyroelectric elements, which utilize the ferroelectricity of the ferroelectric film device.

A basic element which utilizes ferroelectricity is configured as a ferroelectricity-exhibiting element having a ferroelectric film and a pair of electrode layers for exhibiting the ferroelectric properties of the ferroelectric film and utilizing the on/off of the ferroelectric properties.

(Film Capacitor)

Figure 4:
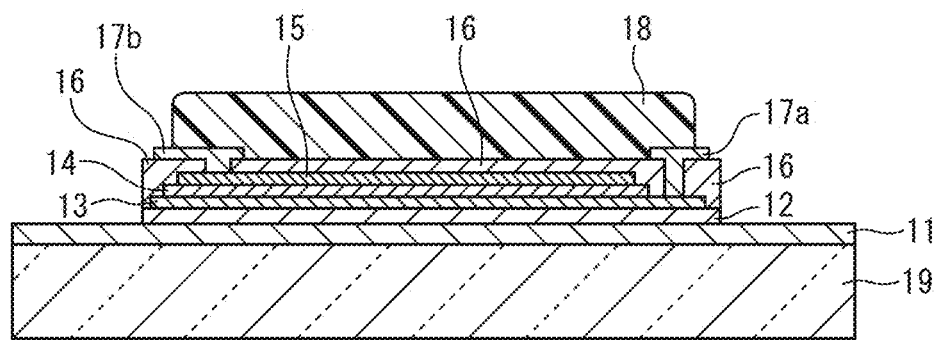
FIG. 4 shows an example of a film capacitor.

An example of a film capacitor is shown in FIG. 4. The film capacitor according to the present invention comprises at least one layer having MIM structure composed of a ferroelectric 14, in place of a conventional dielectric, a first internal electrode 13 arranged on one main surface of the ferroelectric, and a second internal electrode 15 arranged on the other main surface of the ferroelectric, a first intermediate electrode 17a for electrically-connecting the first internal electrode 13 and a first external electrode (not illustrated), and a second intermediate electrode 17b for electrically-connecting the second internal electrode 15 and a second external electrode (not illustrated). Though FIG. 4 shows the case where the MIM structure is one layer, a plurality of MIM structures may be laminated. When a plurality of MIM structures are laminated, the internal electrode of one MIM structure can also serve as the internal electrode of another MIM structure. The film capacitor further comprises protective films 12, 16 arranged so as to cover the MIM structures, and the protective films 12, 16 are arranged so as to cover the MIM structure and the intermediate electrodes 17a, 17b penetrate them. In FIG. 4, the film capacitor is formed on a support substrate 19 via a release layer 11, and a bonding resin 18 is formed on the first protective film 16. The intermediate electrodes 17a, 17b penetrate the first protective film 16 and reach the interface between the first protective film 16 and the bonding resin 18, and extend along this interface toward one end surface of the film capacitor. The intermediate electrodes 17a, 17b may reach the interface with different bonding resins 18 after penetrating the first protective film 16, or may reach the interface with the same bonding resin 18. At this time, it is not necessary that exposure be carried out. It is desirable that the intermediate electrodes 17a, 17b be exposed to the end surface of the protective film. A plurality of film capacitors produced on support substrates 19 are prepared, the film capacitors are bonded to each other using a bonding technique, one of the support substrates 19 is peeled, and the bonding/peeling process is repeated as many times as necessary, whereby a laminated film capacitor having a desired number of layers can be produced.

(Ferroelectric Memory)

Figure 5:
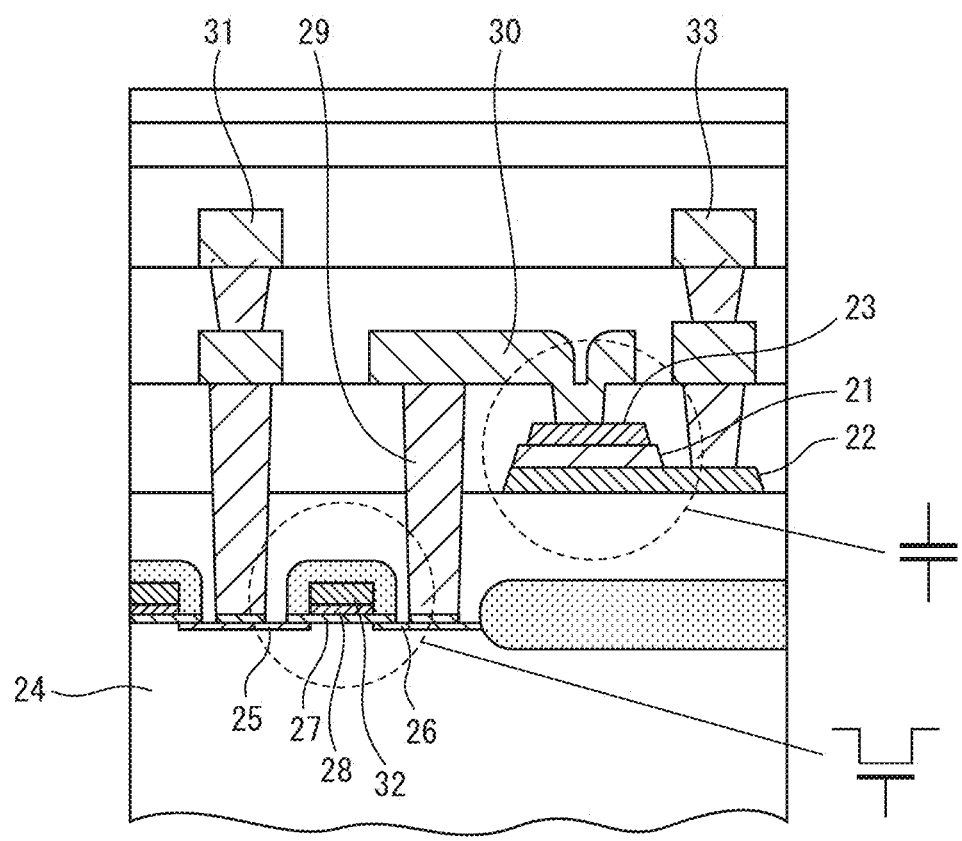
FIG. 5 shows an example of a ferroelectric memory.

FIG. 5 shows an example of a ferroelectric memory. This ferroelectric memory is a 1T1C type (capacitor type) that combines a ferroelectric capacitor (C) and a MOS (metal-oxide semiconductor) FET (T) for memory cell selection. Using this as a basis, there is also a 2C2T type which enhances the reliability of data by polarization of the two capacitors in opposite directions. There is also a 1T type (transistor type) using an MFS-FET or MFMIS-FET the gate insulating film of which is composed of ferroelectric, and this is particularly distinguished by being referred to as FFTAM.

Referring to FIG. 5, the ferroelectric substance film 21 is interposed from above and below between a lower electrode 22 and an upper electrode 23, which are composed of conductive films, to form a capacitor. The MOSFET has a gate electrode layer 28, via a gate insulating film 27 composed of an insulation film, on a semiconductor region of a low-concentration impurity region between a source 25 and a drain 26 of high-concentration impurity regions in the semiconductor layer 24. One electrode of the capacitor (upper electrode 23) and one of the source and the drain of the MOSFET (for example, the drain 26) are electrically connected by a via filling 29 and a wiring layer 30 to form a 1T1C type memory cell. Bit lines 31 and word lines 32 run vertically and horizontally in a grid pattern on the semiconductor substrate, and memory cells are arranged at the intersections thereof. In the example of FIG. 5, the lower electrode 22 of the capacitor is connected to a ground 33, the source and the drain of the MOSFET (source 25) are connected to the bit line 31, and the gate electrode layer 28 of the MOSFET is connected to the word line 32.

(Transistor)

Figure 6:
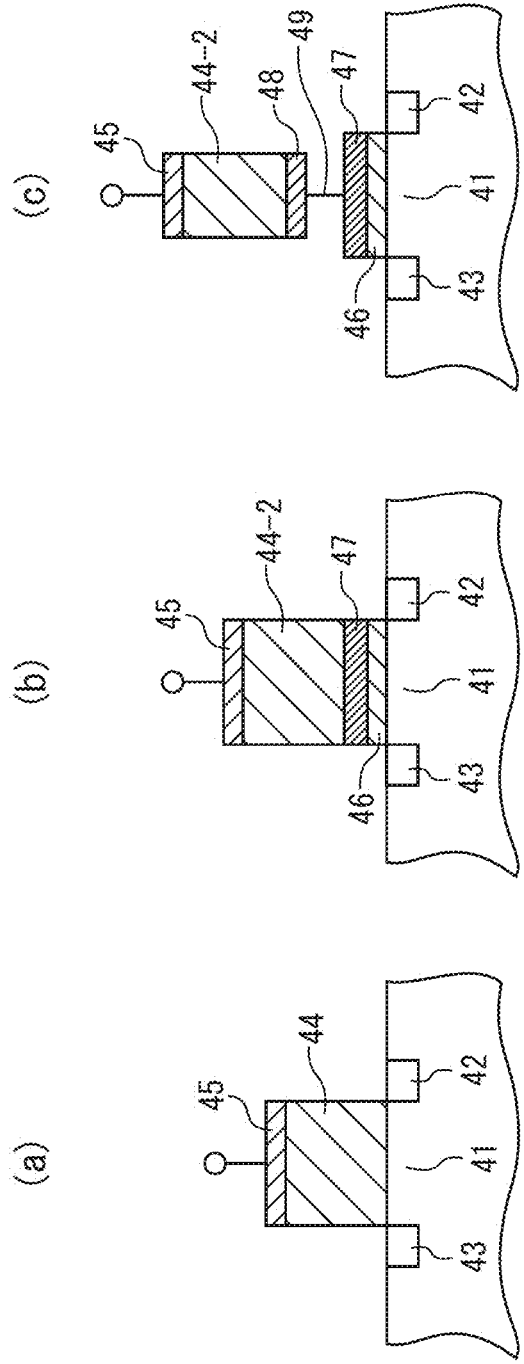
FIG. 6 shows a structural example of a field effect transistor comprising a ferroelectric.

FIG. 6 shows an example of the structure of a field effect transistor comprising a ferroelectric. FIG. 6(a) schematically shows an MFS transistor comprising a metal layer gate electrode 45 on a semiconductor layer 41 via a ferroelectric 44 between a source 42 and a drain 43 composed of a high-concentration impurity region of the semiconductor layer 41. FIG. 6(b) schematically shows an MFMIS transistor which comprises a dielectric layer 46 on the semiconductor layer 41 between the source 42 and the drain 43 composed of the high-concentration impurity region of the semiconductor layer 41, which is configured as a MOSFET, and in which a conductive layer 47 of a metal layer, a ferroelectric 44-2, and a gate electrode 45, are laminated on the dielectric layer 46 to form a capacitor. In the MFMIS transistor shown in FIG. 6(b), the MOSFET and the capacitor are laminated and integrated with each other, but in FIG. 6(c), the MOSFET and the capacitor are not laminated and not integrated, but are separated from each other. In FIG. 6(c), the capacitor is composed of a laminate of a conductive layer 48, a ferroelectric 44-2, and a gate electrode 45, and is electrically connected to the conductive layer 47 of the MOSFET via wiring 49.

By replacing the gate insulating film of a conventional MOSFET with a ferroelectric substance film, a negative capacitance transistor (NCFET) which can increase the surface potential by utilizing the negative capacitance generated by ferroelectric and steep the subthreshold characteristics can be constructed. It is considered that the subthreshold characteristics can be steepened by the polarization reversal of the ferroelectric layer, which is the gate insulating film.

In the transistors shown in FIGS. 6(b) and 6(c), it is known that an excellent ferroelectric tunnel junction type (FJT) memory can be realized by using the dielectric layer 46 as a ferroelectric substance film. The FJT transistor constituting the ferroelectric junction tunnel (FJT) memory has a tunnel junction formed by the ferroelectric substance film at the junction between the gate and the semiconductor region between the source and the drain. As the FJT, conventionally, an MFM structure in which the ferroelectric film is interposed between electrodes, an MFIM structure in which an insulator is further added to the MFM structure, or a further modified MIFIM structure or MFIFM structure is often used. MFTJ having a structure in which a magnetic material is used for the M phase of the electrode is also used. Here, F is the ferroelectric, M is the metal, I is the insulator, T is the tunnel, and J is the junction.

(Ferroelectric Data Storage)

Like a hard disk using a ferromagnetic material, a hard disk storage medium (ferroelectric data storage) can be configured by using a ferroelectric. Magnetic data storage is attracting attention as it can further improve storage density as compared with a hard disk using a ferromagnetic material (the limit is approximately 1 Tbit/inch$^2$). In particular, crystals having a fluorite-type structure of an orthorhombic crystal phase such as $HfO_2$ exhibit high ferroelectricity even if the film thickness is thin, and are therefore promising as materials for ferroelectric data storage. Ferroelectric data storage has, for example, a structure in which a ferroelectric substance film is laminated on a substrate via a common electrode layer, and information is recorded by forming a domain with upward or downward polarization by applying a voltage from above the utilized data storage using a probe (opposite electrode).

(Pyroelectric Element)

Figure 7:
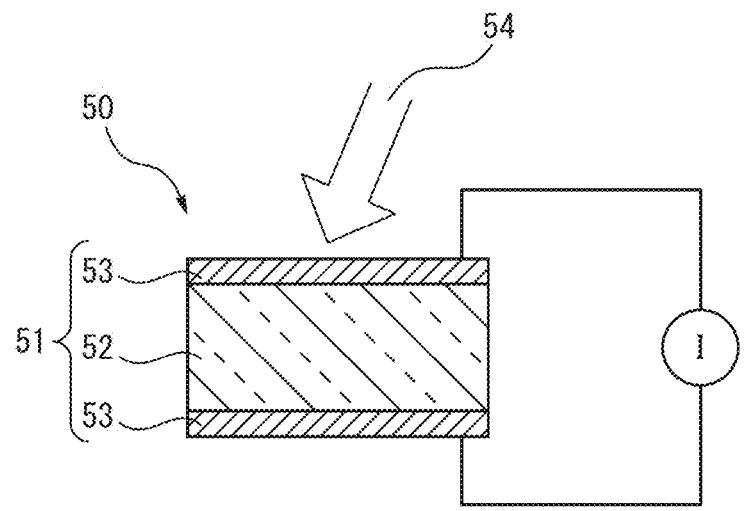
FIG. 7 schematically shows an example of a pyroelectric power generator.

FIG. 7 schematically shows an example of a pyroelectric power generator 50. A pyroelectric element 51 interposes a ferroelectric 52 between the electrodes 53. When a heat source 54 which changes with time acts on the pyroelectric element 51, a voltage that fluctuates in the ferroelectric 52 in response to the temperature change is generated to generate electricity.

An infrared sensor can be constructed by utilizing the pyroelectric effect of ferroelectrics (a phenomenon in which an electric charge is generated on the surface of a substance in response to changes in temperature). An infrared sensor using infrared is a type of thermal sensor which converts infrared rays into heat energy and measures it, and does not require cooling and is sensitive to long wavelength bands (far infrared region: 5 to 1000 μm), and compared with other thermal sensors using thermistors and thermocouples, it is superior in terms of sensitivity, S/N, and responsiveness.

(Electro-Optical Element)

Figure 8:
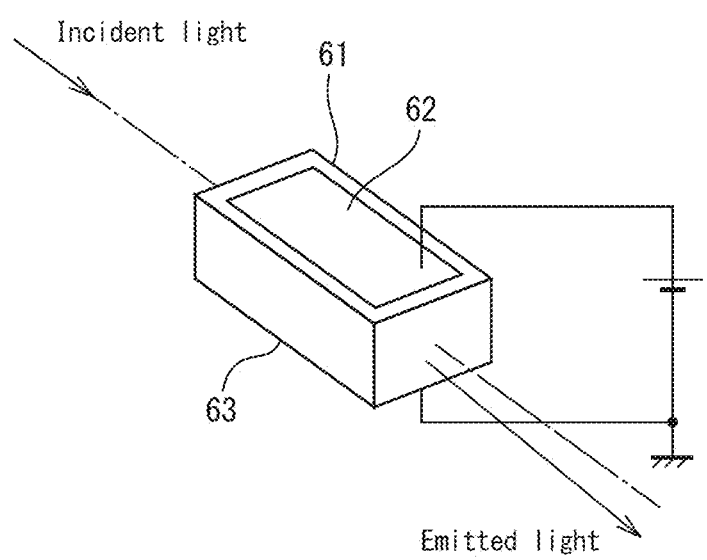
FIG. 8 shows an example of a light deflector using a ferroelectric as an example of an electro-optical element.

FIG. 8 shows an example of a light deflector using a ferroelectric as an example of an electro-optical element. In light deflectors, a positive electrode 62 and a negative electrode 63, which are parallel flat plates, are formed on the opposite surfaces of the ferroelectric 61. By applying a DC voltage between the positive electrode 62 and the negative electrode 63, the incident light can be deflected in the direction of application of the electric field and output as the emitted light.

(Other Ferroelectric Functional Elements or Devices)

Ferroelectric functional elements or devices utilizing the ferroelectricity of the ferroelectric film of the present invention is not limited to the above-mentioned examples of capacitors, electro-optical elements, memory elements, transistors, ferroelectric data storages, and pyroelectric elements, and it is clear that they can be widely applied to various other ferroelectric functional elements or devices, and various aspects thereof.

The ferroelectric film provided by the present invention is a piezoelectric material, and can be applied to piezoelectric elements utilizing the piezoelectric material characteristics and a functional elements or devices using the piezoelectric material.

(Piezoelectric Element)

Figure 9:
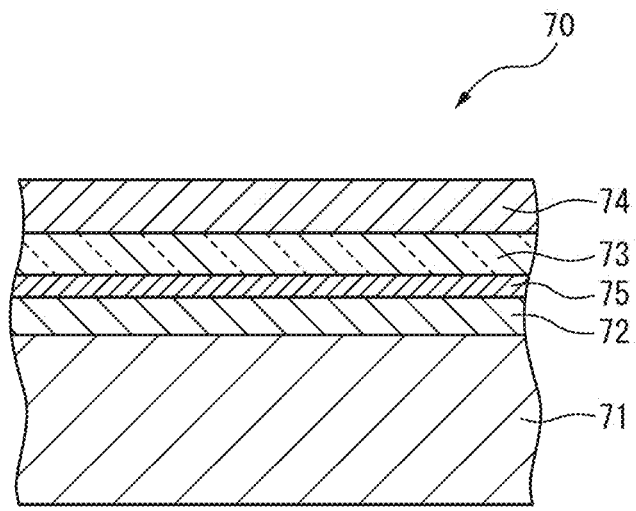
FIG. 9 is a cross-sectional view showing an example of the laminate structure of a piezoelectric element.

Piezoelectric elements have structures in which the piezoelectric body is interposed between electrode layers composed of conductive layers in order to exhibit the piezoelectric characteristics of the ferroelectric characteristics and to utilize the on/off of the piezoelectric characteristics. FIG. 9 shows an example of the laminate structure of the piezoelectric element 70. The piezoelectric element 70 comprises a substrate 71 having a lower electrode 72, a piezoelectric body 73 on the lower electrode 72, and an upper electrode 74, in which a buffer layer 75 may be provided between the substrate 71 and the lower electrode 72, if necessary.

(Piezoelectric Sensor)

The piezoelectric element can be structurally a piezoelectric sensor as it is. In piezoelectric elements, when a voltage is applied to the piezoelectric body interposed between the electrodes, the piezoelectric body expands and contracts, whereas in piezoelectric sensors, when the piezoelectric body expands and contracts, a voltage is generated between the electrodes interposing the piezoelectric body, whereby the pressure applied to the piezoelectric sensor can be detected from the voltage.

(Actuator)

Actuators are devices which deforms the piezoelectric body itself by applying a voltage to the piezoelectric element (inverse piezoelectric effect) to generate a mechanical force. Since the ferroelectric substance film of the present invention can be formed on an organic substrate, it is promising as a flexible actuator.

(Inkjet Head)

Figure 10:
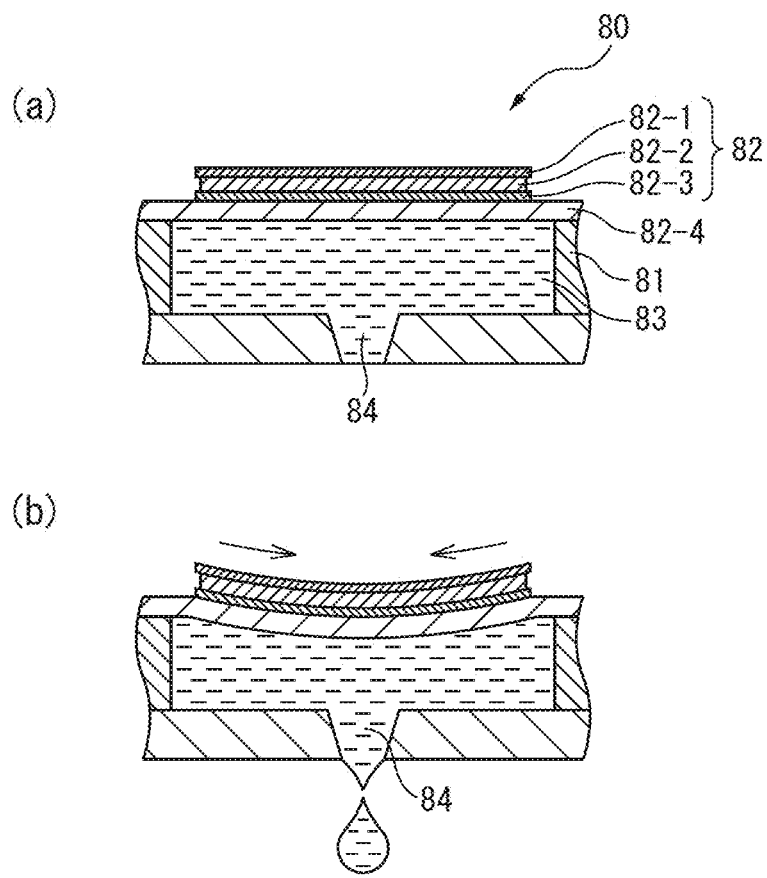
FIG. 10 is a cross-sectional view showing an example of an inkjet head.

FIG. 10(a) shows a cross-sectional view of an example if an inkjet head 80. The inkjet head 80 comprises a piezoelectric element 82 on a wall surface of an ink pressurization chamber 81 fluidly connected to an ink chamber (not illustrated). The piezoelectric element 82 is formed by laminating an upper electrode layer 82-1, a ferroelectric substance film 82-2, and a lower electrode layer 82-3, and is laminated on an elastic body layer 82-4 forming a part of the wall surface of the ink pressurization chamber 81. Thus, as shown in FIG. 10(b), the piezoelectric element 82 is driven to deform the elastic layer 82-4 along with the piezoelectric element 82 toward the inside of the pressurization chamber 83, whereby the ink in the pressurization chamber 83 is pressurized, and the ink is ejected from the nozzle 84.

(Hard Disk Drive Head)

Figure 11:
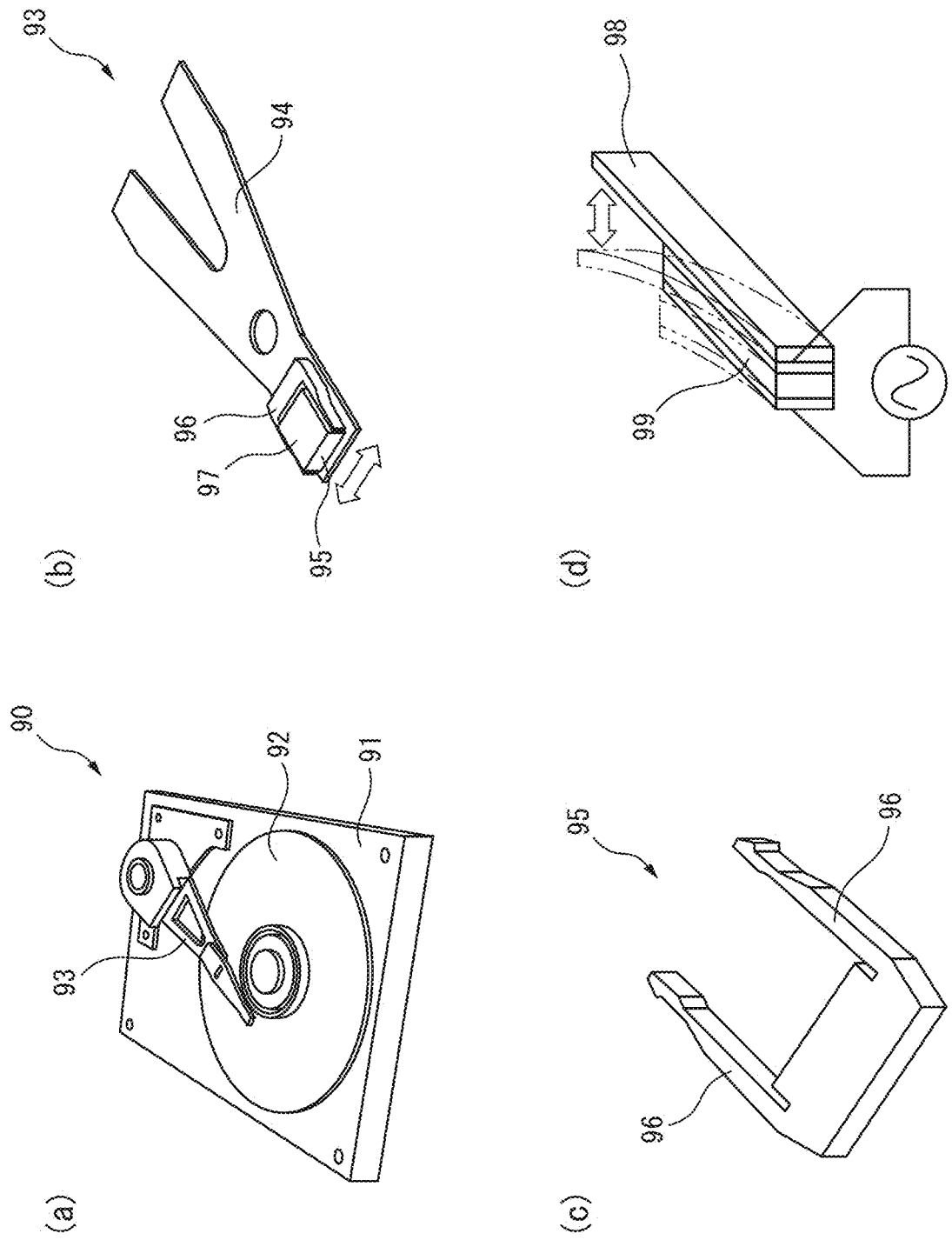
FIG. 11 is a schematic view showing an example of a hard-disk drive.

Referring to FIG. 11(a), a hard disk drive 90 includes a main body 91 on which a hard disk 92 is rotatably mounted, and a hard disk drive head 93 for reading and writing information on the hard disk 92. FIG. 11(b) is an enlarged view of the back side of the suspension portion of the hard disk drive head 93, which has a magnetic head 95 at the tip of the suspension 94, piezoelectric microactuators 96, and a slider 97. FIG. 11(c) is an enlarged view of the magnetic head 95, and there are two piezoelectric microactuators 96 on both sides so as to interpose the magnetic head 95 and the slider 97. FIG. 11(d) shows the details of the piezoelectric microactuator 96, which is composed of a ceramic thin plate 98 and a piezoelectric element 99, and when the piezoelectric element 99 expands and contracts, the ceramic thin plate 98 rotates and the slider 97 also rotates. In the hard disk drive head shown in FIG. 11, the magnetic head rotates in the horizontal direction by a piezoelectric microactuator at the tip of the suspension, and there is also a type in which the piezoelectric microactuator rotates in the vertical direction to rotate the magnetic head in the vertical direction.

(Gyro Sensor)

Figure 12:
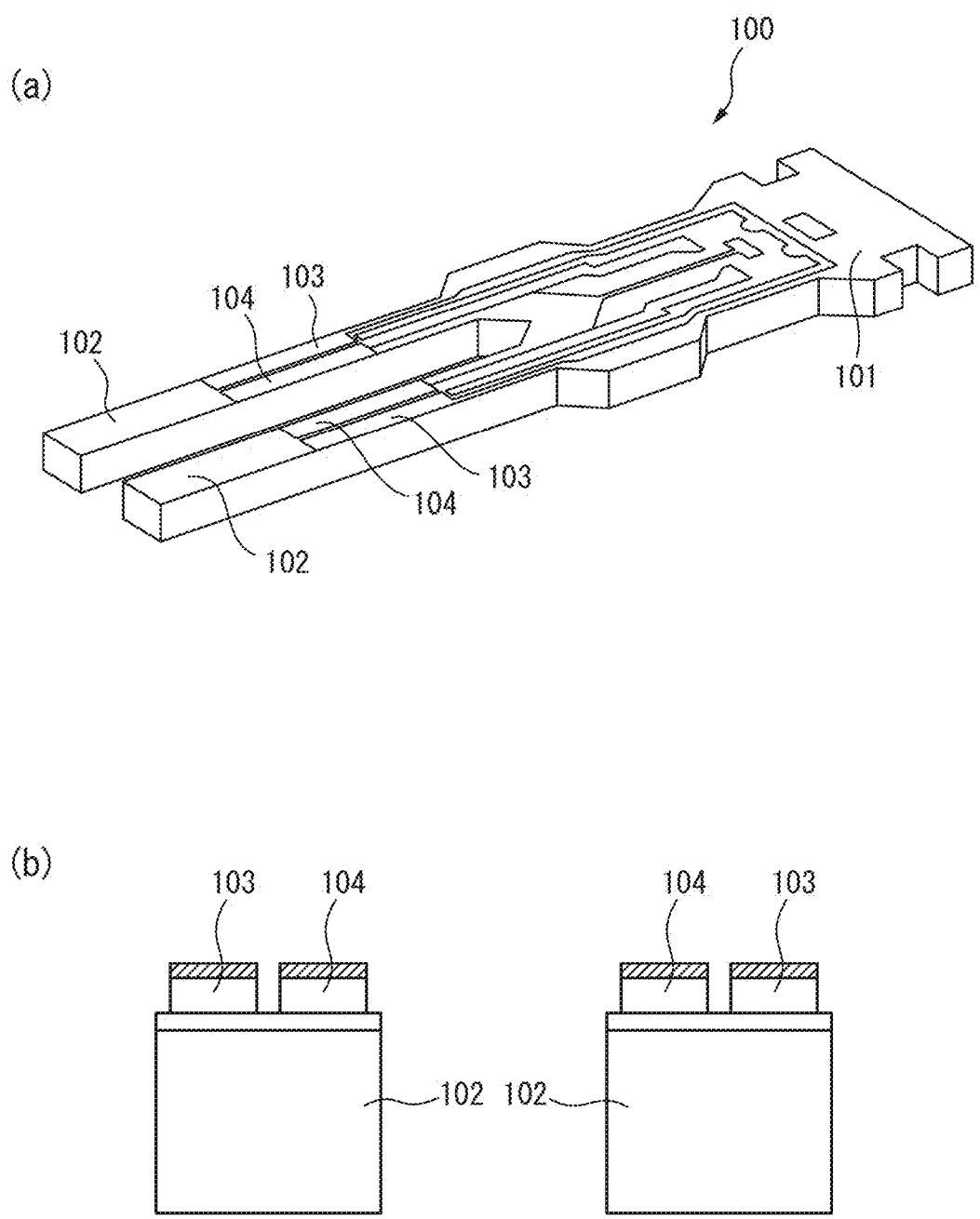
FIG. 12 is a schematic view showing an example of a gyro sensor.

FIG. 12 is an example of a gyro sensor 100. As can be seen in the perspective view of FIG. 12(a), the gyro sensor 100 comprises a substrate portion 101 and a pair of arms 102 extending from the substrate portion 101, and has a tuning fork structure. An end view of the pair of arms 102 viewed from the tip direction is shown in FIG. 12(b). The pair of piezoelectric elements 103 and 104 are formed on the main surface of the arms 102, which is composed of silicon. In a state of vibrating in the direction connecting the arms 102, the angular velocity of rotation can be obtained by detecting the vibration in the direction perpendicular to the direction connecting the arms 102.

(Vibration Power Generator)

Figure 13:
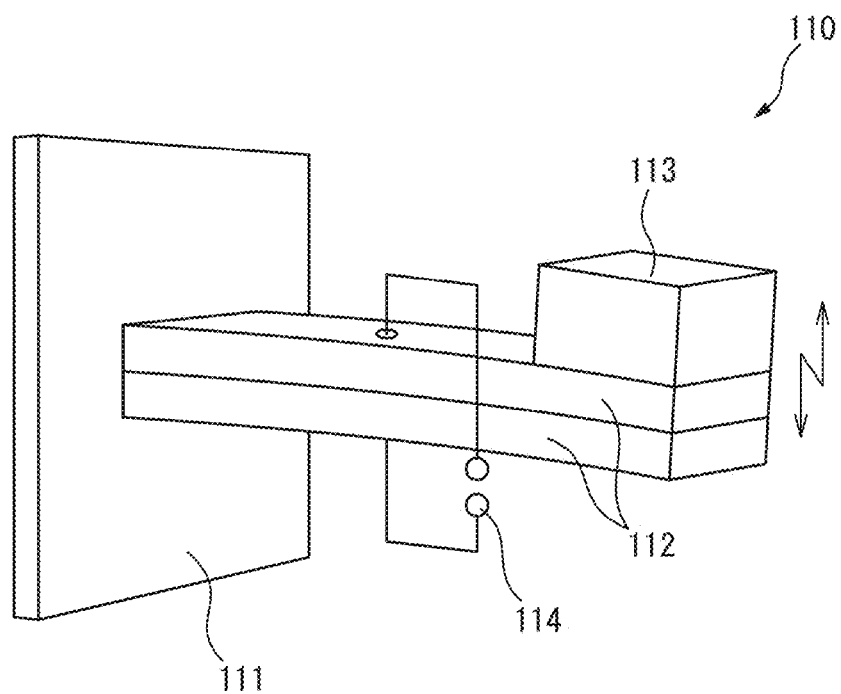
FIG. 13 is a view detailing the concept of vibration power generation.

FIG. 13 is a diagram illustrating the principle of vibration power generation. In the vibration power generation device 110, one end of a piezoelectric element 112 is affixed to a skeleton 111 in a vibrable manner, and a weight 113 is installed at the tip portion of the piezoelectric element 112 to facilitate the vibration of the piezoelectric element 112. When the piezoelectric element 112 vibrates, a voltage is generated in the piezoelectric element 112 to generate electricity. Since the ferroelectric substance film of the present invention can be formed on a flexible organic substrate, it is promising as a vibrator.

(SAW Resonator)

FIG. 14 shows an example of a surface acoustic wave (SAW) resonator. In the SAW resonator 120 of FIG. 14, two ports 122 and 123, specifically, comb-shaped electrodes (IDT/Inter Digital Transducers) for input and output are arranged in the center of a main surface of a piezoelectric substrate 121, and reflectors 124 are installed on both end sides thereof. Both sides of the piezoelectric substrate 121 may be composed of a sound absorbing material instead of the reflector 124. Alternatively, only a single-port comb-shaped electrode (IDT) may be placed in the center of the main surface of the piezoelectric substrate 121. In this case, one electrode 125 of the comb-shaped electrode (IDT) is for input and the other electrode 126 is for output. When an electric signal is applied to the input IDT, a surface acoustic wave is generated, and the surface acoustic wave propagates along the surface of the substrate and reaches the output IDT, where it is again converted into an electric signal. The resonance frequency (usually several tens of MHz to several GHz) is determined by the shape of the comb-shaped electrode (IDT). The reflector 124 reflects surface acoustic waves.

(FBAR)

Figure 15:
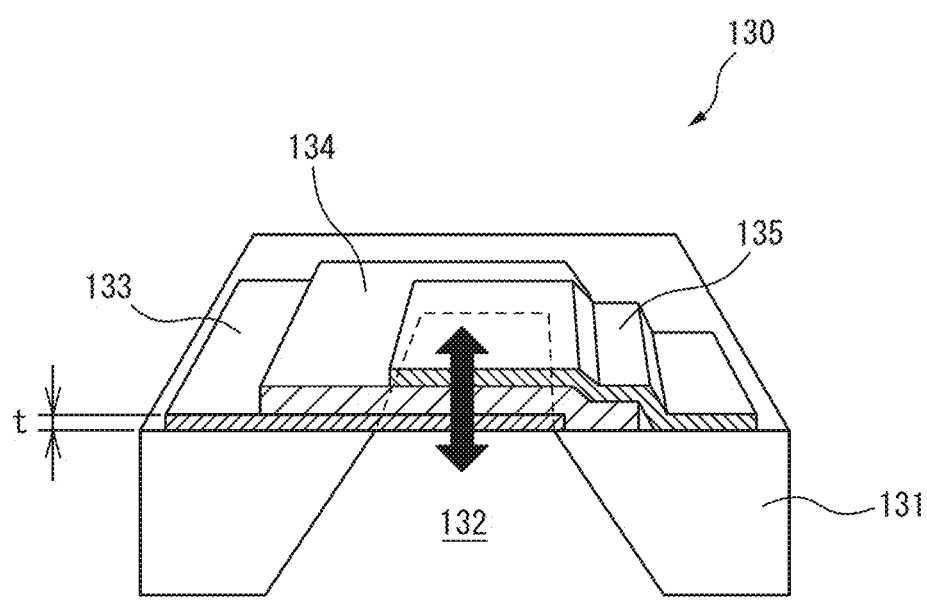
FIG. 15 is a schematic view showing an example of a Film Bulk Acoustic Resonator (FBAR).

An example of a film bulk acoustic resonator (FBAR/Film Bulk Acoustic Resonator) 130 is shown in FIG. 15. A cavity 132 is provided in the silicon substrate 131, a piezoelectric element composed of a lower electrode 133, a piezoelectric body 134, and an upper electrode 135 is formed in a portion where the cavity 132 on the main surface of the silicon substrate 131 is open, and the piezoelectric element vibrates in the bulk direction, i.e., in the stacking direction (vertical direction in the drawing), and the resonance frequency is determined by the size of the opening and the thickness of the piezoelectric body 134. Both SAW resonators and film bulk acoustic resonators utilize the property that the velocity of the wave propagating to the elastic body is orders of magnitude slower than the propagation velocity in space, and form resonators with a high frequency (usually several tens of MHz to several GHz).

(Piezoelectric Mirror)

Figures 1, 16:
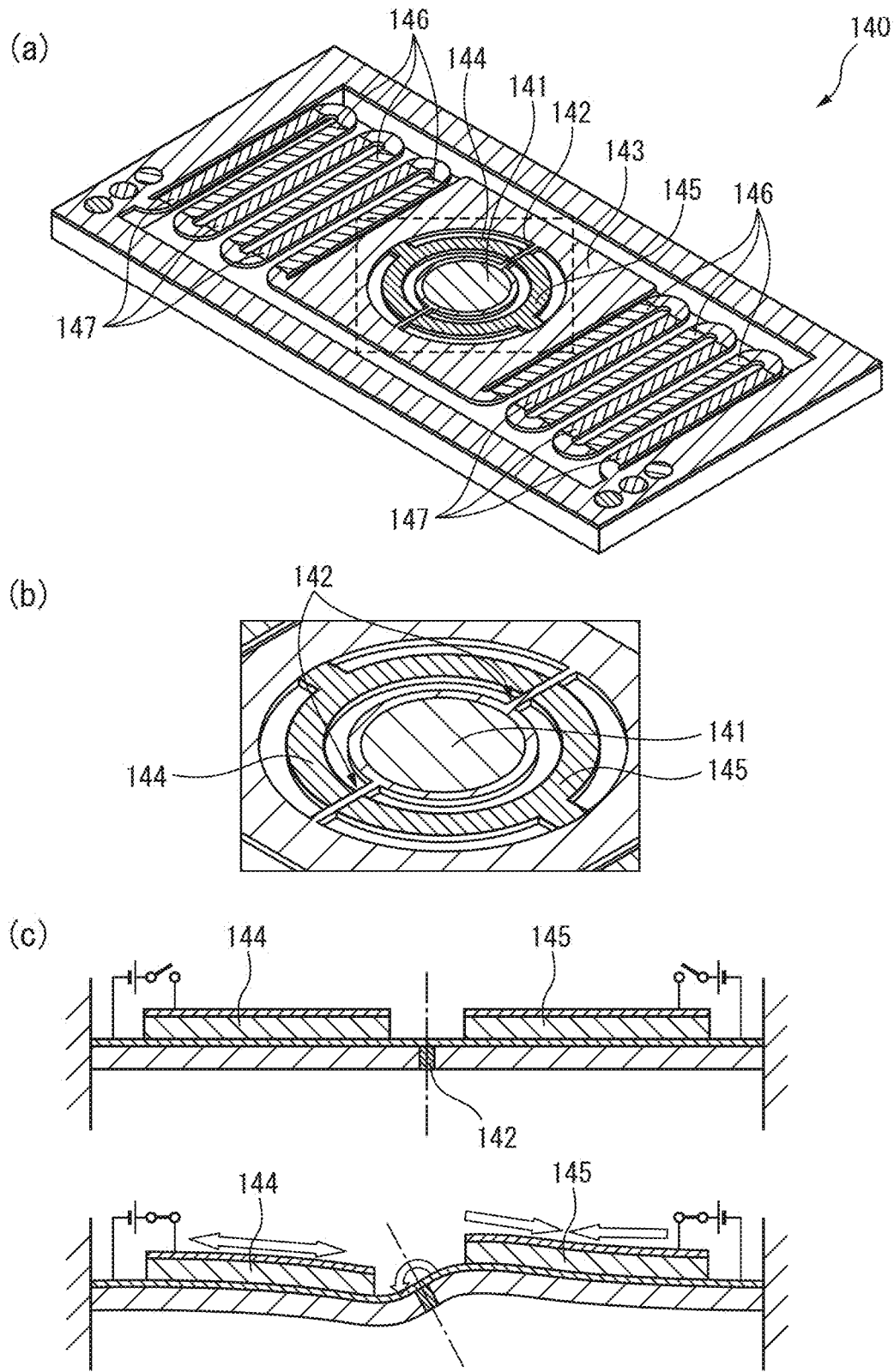
Figure 16:
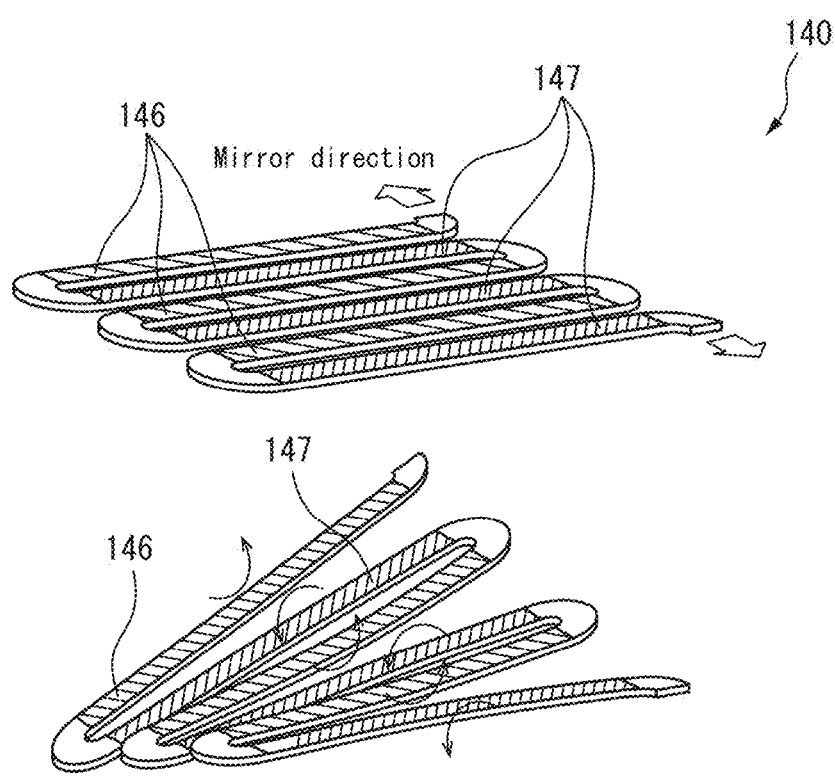
Figure 2:
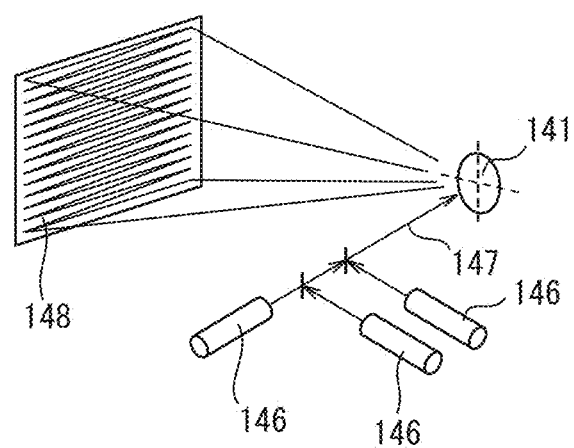

Examples of piezoelectric mirrors are shown in FIGS. 16-1 and 16-2. Referring to FIG. 16-1(*a*), a piezoelectric mirror element 140 is connected to a first support 143 via a torsion bar 142 which rotatably holds the mirror 141. As shown enlarged in FIG. 16-1(*b*), the first support 143 has piezoelectric elements 144 and 145 on both sides of the torsion bar 142, when a voltage having a resonance frequency is applied to the first and second piezoelectric elements 144 and 145, as shown in FIG. 16-1(*c*), the mirror 141 rotates with respect to the first support 143 about the torsion bar 142 as the axis due to the twisting of the torsion bar 142 due to the expansion and contraction of the first and second piezoelectric elements 144 and 145. Referring again to FIG. 16-1(*a*), the first support 143 alternately holds the third piezoelectric element 146 and the fourth piezoelectric element 147 in a zigzag manner, and the outermost third and fourth piezoelectric elements 146 and 147 are connected to the second support 148. FIG. 16-2(*d*) schematically shows the deformation of the piezoelectric element when the third piezoelectric element 144 and the fourth piezoelectric element 145 connected in a zigzag shape are driven, and due to the deformation of the third and fourth piezoelectric elements 146 and 147, the first support 143 rotates with respect to the second support 148 about the connecting portion as the axis. The rotation of the mirror 141 by the third and fourth piezoelectric elements 145 is orthogonal to the rotation of the first and second piezoelectric elements 144 and 145 about the axis of the torsion bar 142 in the axial direction. Thus, according to the piezoelectric mirror element 140, the mirror 141 can rotate in both the vertical direction and the horizontal direction, and as a result, the reflection direction of the mirror 141 can be changed in both the vertical direction and the horizontal direction, and as shown in FIG. 16-2(*e*), it is possible to scan the light beam 147 incident on the mirror 141 with the light source 146 in both the vertical and horizontal directions on the screen 148, i.e., in the entire screen.

(Functional Elements or Devices Using Other Piezoelectric Materials)

It is clear that the functional elements or devices using the piezoelectric material of the present invention can be applied not only to the above examples but also to various devices using the piezoelectric body and various embodiments thereof. For example, it can be applied to ultrasonic probes, ultrasonic transmitters, and ultrasonic sensors.

EXAMPLES

The present invention will be described below with reference to the Example, but the present invention is not limited to these Examples.

(Ferroelectric Measurement)

In the following Examples, film polarization hysteresis measurement (ferroelectricity measurement) is carried out using a ferroelectric tester (FCE-1A type manufactured by Toyo Corporation). For the deposited film, the upper electrode is Pt and is prepared by electron beam evaporation so as to have a film thickness of 20 to 100 nm and a diameter of 50 to 100 μm.

Example 1

Film formation was carried out using a sputtering device as schematically shown in FIG. 2. The sputtering device comprised, in a vacuum chamber, a substrate holding means which can be heated with a heater, a target setting means, a thermometer, a gas supply port, an exhaust port for pressure reduction, and a power supply for applying a voltage between the substrate and the target. The pressure inside the vacuum chamber was reduced, a voltage was applied between the substrate and the target, and the ionized gas sputters the target to form a film on the substrate.

The substrate used was an ITO/YSZ111 substrate obtained by forming an ITO film of approximately 50 nm on a yttria-stabilized zirconia (Y10%-YSZ111) having a thickness of 500 μm and a (111) orientation, and the target used was a target (7% $YO_{1.5}$-93% $HfO_2$) in which 7 mol % yttria ($YO_{1.5}$) was mixed with 93 mol % of hafnia ($HfO_2$). The substrate temperature was set to 50° C., and the atmosphere in the chamber was first replaced with argon and evacuated, and the atmosphere then was adjusted to an argon flow rate of 100 sccm, oxygen of 0 sccm, and a pressure of 10 mTorr. The sputtering power was 10 to 50 W.

Figure 17:
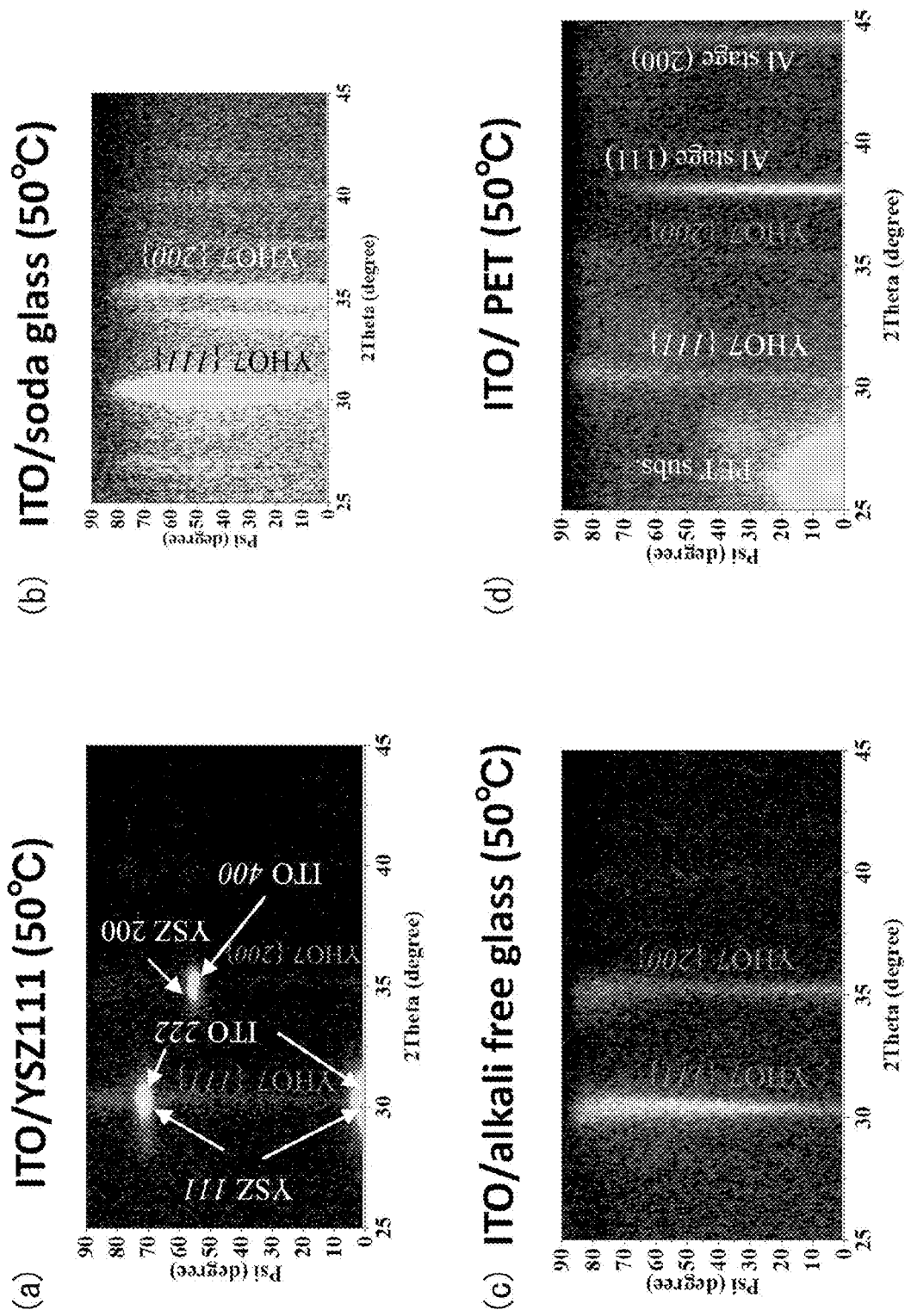
FIG. 17 is an X-ray diffraction analysis chart of the 7% $YO_{1.5}$-93% $HfO_2$ films obtained in Examples 1 to 4.

A film of 7% $YO_{1.5}$-93% $HfO_2$ was deposited on the ITO/YSZ111 substrate to a thickness of 160 nm. The chart obtained by X-ray diffraction analysis of the obtained 7% $YO_{1.5}$-93% $HfO_2$ film is shown in FIG. 17(*a*). From FIG. 17(*a*), it was confirmed that the 7% $YO_{1.5}$-93% $HfO_2$ film (in the drawing, the crystal having this composition is referred to as YHO7, the same is true in other drawings) was polycrystalline, that it partially comprises an epitaxial phase (single crystal layer), and that it had a fluorite-type structure of an orthorhombic crystal phase or tetragonal crystal phase.

The result of the polarization hysteresis measurement (polarization-electric field relationship) of this 7% $YO_{1.5}$-93% $HfO_2$ polycrystalline film is shown in FIG. 18(*a*). From FIG. 18(*a*), it was confirmed that the 7% $YO_{1.5}$-93% $HfO_2$ crystalline film exhibits ferroelectricity. After the hysteresis measurement (electric field application), the 7% $YO_{1.5}$-93% $HfO_2$ polycrystalline film exhibited ferroelectricity, confirming that it had an orthorhombic crystal phase.

Example 2: Soda Glass Substrate

The film formation of Example 2 was carried out in the same manner as in Example 1 except that the substrate was changed from ITO/YSZ111 to ITO/soda glass. The ITO/soda glass substrate was obtained by forming an ITO film having a thickness of 150 nm on soda glass having a thickness of 1100 μm.

The chart obtained by X-ray diffraction analysis of the 7% $YO_{1.5}$-93% $HfO_2$ film obtained by depositing on the ITO/soda glass substrate is shown in FIG. 17(*b*). From FIG. 17(*b*), it was confirmed that the 7% $YO_{1.5}$-93% $HfO_2$ film was polycrystalline and had a fluorite-type structure of an orthorhombic crystal phase or tetragonal crystal phase.

The result of the polarization hysteresis measurement (polarization-electric field relationship) of the 7% $YO_{1.5}$-93% $HfO_2$ polycrystalline film is shown in FIG. 18(*b*). From FIG. 18(*b*), it was confirmed that the 7% $YO_{1.5}$-93% $HfO_2$ polycrystalline film exhibits ferroelectricity. After the hysteresis measurement, the 7% $YO_{1.5}$-93% $HfO_2$ polycrystalline film exhibited ferroelectricity, confirming that it had an orthorhombic crystal phase.

Example 3: Alkali-Free Glass Substrate

The film formation of Example 3 was carried out in the same manner as in Example 1 except that the substrate was changed from ITO/YSZ111 to ITO/alkali-free glass. The ITO/alkali-free glass substrate was obtained by forming an ITO film having a thickness of 150 nm on an alkali-free glass having a thickness of 700 μm.

The chart obtained by X-ray diffraction analysis of the 7% $YO_{1.5}$-93% $HfO_2$ film obtained by depositing on the ITO/alkali-free substrate is shown in FIG. 17(*c*). From FIG. 17(*c*), it was confirmed that the 7% $YO_{1.5}$-93% $HfO_2$ film was polycrystalline and had a fluorite-type structure of an orthorhombic crystal phase or tetragonal crystal phase.

The result of the polarization hysteresis measurement (polarization-electric field relationship) of this 7% $YO_{1.5}$-93% $HfO_2$ polycrystalline film is shown in FIG. 18(*c*). From FIG. 18(*c*), it was confirmed that the 7% $YO_{1.5}$-93% $HfO_2$ polycrystalline film exhibits ferroelectricity. After the hysteresis measurement, the 7% $YO_{1.5}$-93% $HfO_2$ polycrystalline film exhibited ferroelectricity, confirming that it had an orthorhombic crystal phase.

Example 4: PET Substrate

The film formation of Example 4 was carried out in the same manner as in Example 1 except that the substrate was changed from ITO/YSZ111 to ITO/polyethylene terephthalate (ITO/PET). The ITO/PET substrate was obtained by forming an ITO film having a thickness of 150 nm on a polyethylene terephthalate film (heat resistance temperature of 200° C.) having a thickness of 150 μm.

The chart obtained by X-ray diffraction analysis of the 7% $YO_{1.5}$-93% $HfO_2$ film obtained by depositing on the ITO/PET substrate is shown in FIG. 17(*d*). From FIG. 17(*d*), it was confirmed that the 7% $YO_{1.5}$-93% $HfO_2$ film was polycrystalline and had a fluorite-type structure of an orthorhombic crystal phase or tetragonal crystal phase.

The result of the polarization hysteresis measurement (polarization-electric field relationship) of this 7% $YO_{1.5}$-93% $HfO_2$ polycrystalline film is shown in FIG. 18(*d*). From FIG. 18(*d*), it was confirmed that the 7% $YO_{1.5}$-93% $HfO_2$ polycrystalline film exhibits ferroelectricity. After the hysteresis measurement, the 7% $YO_{1.5}$-93% $HfO_2$ polycrystalline film showed ferroelectricity, confirming that it had an orthorhombic crystal phase.

Example 5: Room Temperature and 100° C.

The film formation of Example 5 was carried out in the same manner as in Example 1 except that the substrate temperature during sputtering was changed from 50° C. to room temperature (unheated) and 100° C., and the film thickness of the 7% $YO_{1.5}$-93% $HfO_2$ film was 50 nm when deposited at room temperature and 170 nm when deposited at 100° C.

Figure 19:
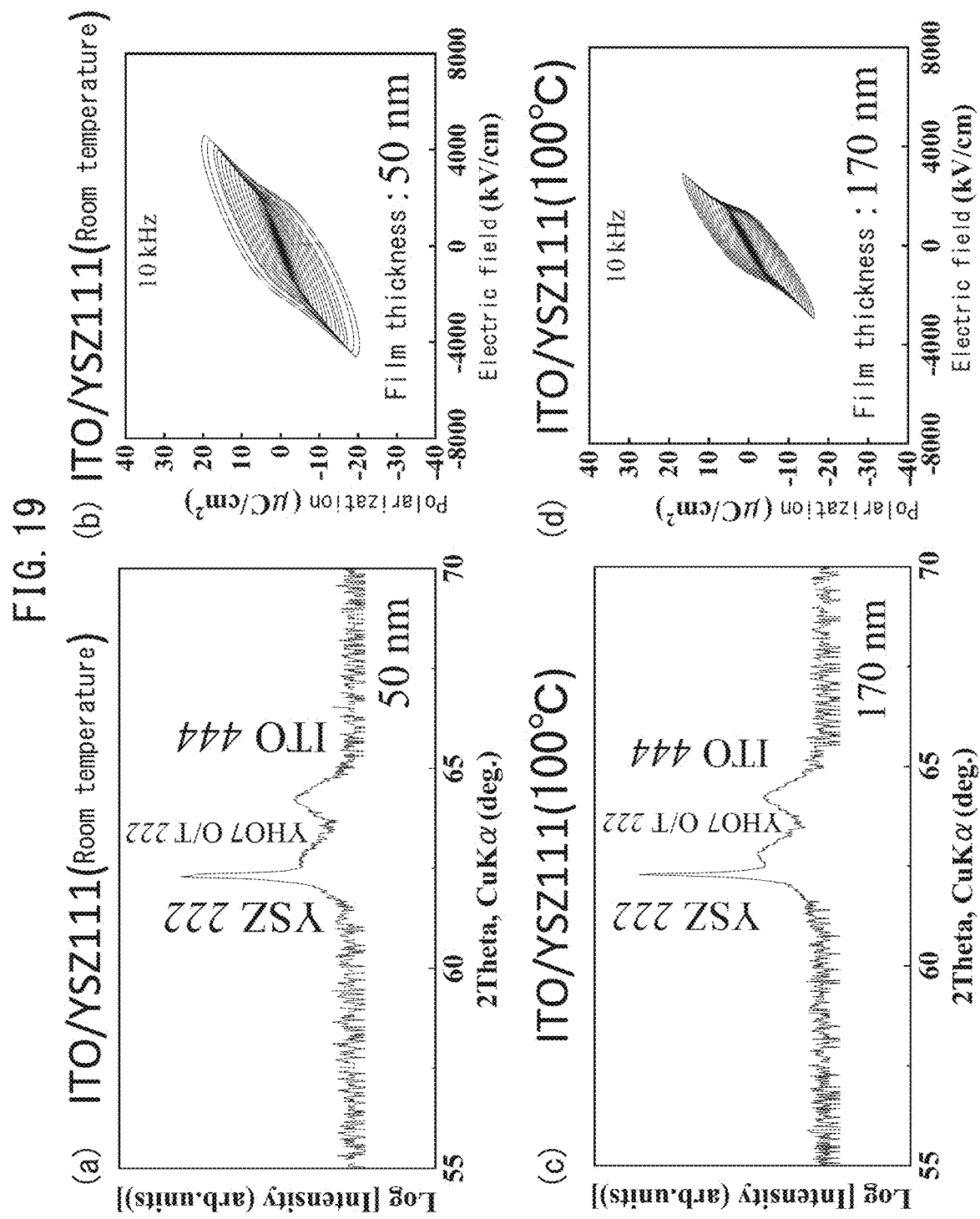
FIG. 19 is an X-ray diffraction analysis chart and a chart showing polarization hysteresis measurement results (polarization-electric field relationship) of the 7% $YO_{1.5}$-93% $HfO_2$ film obtained in Example 5.

The chart obtained by X-ray diffraction analysis of the 7% $YO_{1.5}$-93% $HfO_2$ film obtained at the substrate temperature of room temperature is shown in FIG. 19(*a*). From FIG. 19(*a*), it was confirmed that the 7% $YO_{1.5}$-93% $HfO_2$ film had a fluorite-type structure of an orthorhombic crystal phase or a tetragonal crystal phase (denoted as O/T in the drawing, the same applies hereinafter).

FIG. 19(*b*) shows the results of the polarization hysteresis measurement (polarization-electric field relationship) of the 7% $YO_{1.5}$-93% $HfO_2$ polycrystalline film obtained at the substrate temperature of room temperature. From FIG. 19(*b*), it was confirmed that the 7% $YO_{1.5}$-93% $HfO_2$ polycrystalline film exhibits ferroelectricity. After the hysteresis measurement, the 7% $YO_{1.5}$-93% $HfO_2$ polycrystalline film exhibited ferroelectricity, confirming that it had an orthorhombic crystal phase.

The chart obtained by X-ray diffraction analysis of the 7% $YO_{1.5}$-93% $HfO_2$ film obtained at the substrate temperature of 100° C. is shown in FIG. 19(*c*). From FIG. 19(*c*), it was confirmed that the 7% $YO_{1.5}$-93% $HfO_2$ film had a fluorite-type structure of an orthorhombic crystal phase or tetragonal crystal phase.

FIG. 19(*d*) shows the results of the polarization hysteresis measurement (polarization-electric field relationship) of the 7% $YO_{1.5}$-93% $HfO_2$ film obtained by setting the substrate temperature to 100° C. From FIG. 19(*d*), it was confirmed that the 7% $YO_{1.5}$-93% $HfO_2$ polycrystalline film exhibited ferroelectricity after the hysteresis measurement.

Example 6: Room Temperature, 150 nm

The film formation of Example 6 was carried out in the same manner as in Example 2 except that the substrate temperature during sputtering was changed from 50° C. to room temperature (unheated) and the film thickness of the 7% $YO_{1.5}$-93% $HfO_2$ film was set to 150 nm.

Figure 20:
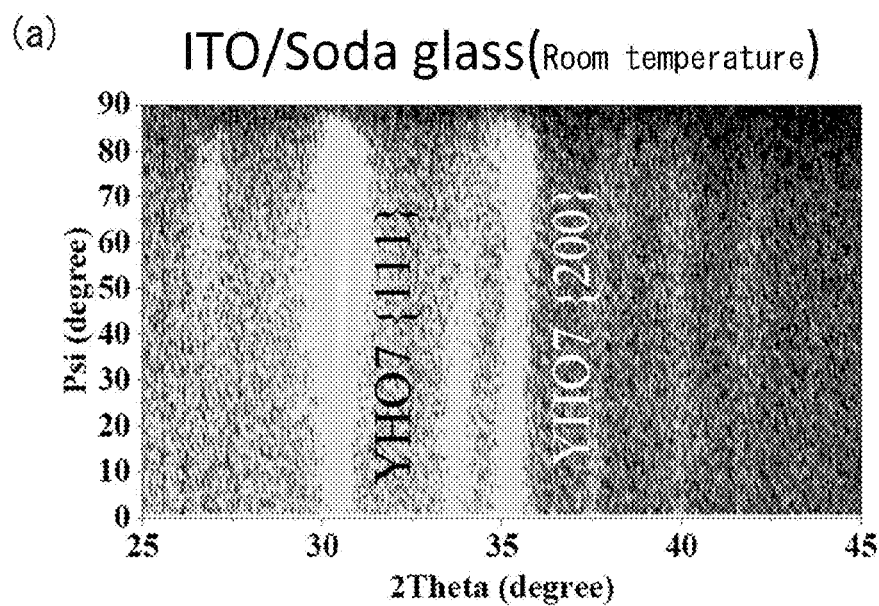
Figure 1:
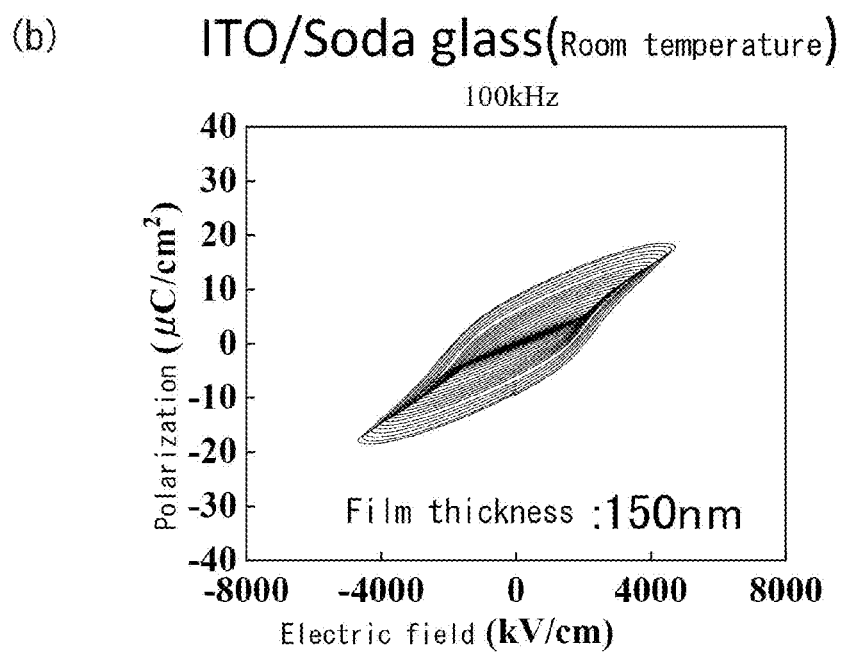
Figures 2, 20:
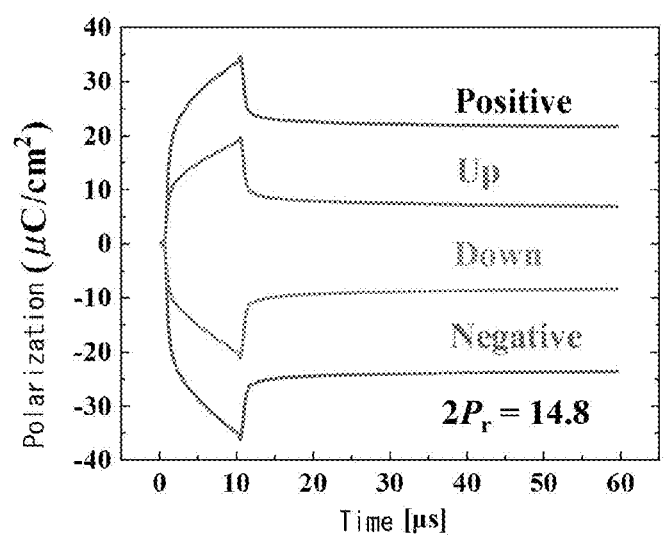

The chart obtained by X-ray diffraction analysis of the obtained 7% $YO_{1.5}$-93% $HfO_2$ film is shown in FIG. 20-1(*a*). From FIG. 20-1(*a*), it was confirmed that the 7% $YO_{1.5}$-93% $HfO_2$ film was polycrystalline and had a fluorite-type structure of an orthorhombic crystal phase or tetragonal crystal phase.

The results of the polarization hysteresis measurement (polarization-electric field relationship) of the obtained 7% $YO_{1.5}$-93% $HfO_2$ film are shown in FIG. 20-1(*b*). FIG. 20-2 shows the polarization measurement results of PUND (Positive-up-negative-down) for the 7% $YO_{1.5}$-93% $HfO_2$ film on the ITO/soda glass substrate. From these results, it was confirmed that ferroelectricity was exhibited.

Example 7: Room Temperature, 210 nm

The film formation of Example 7 was carried out in the same manner as in Example 4 except that the substrate temperature during sputtering was changed from 50° C. to room temperature (unheated) and the film thickness of the 7% $YO_{1.5}$-93% $HfO_2$ film was set to 210 nm.

Figure 21:
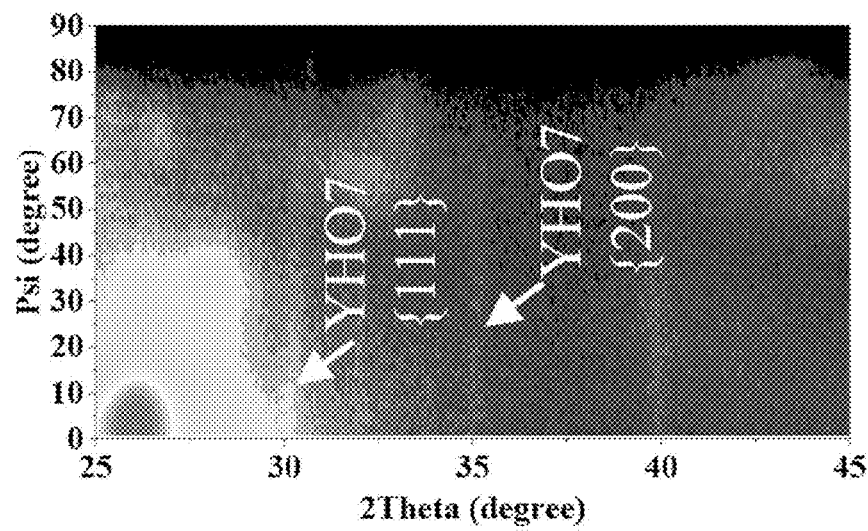
Figure 1:
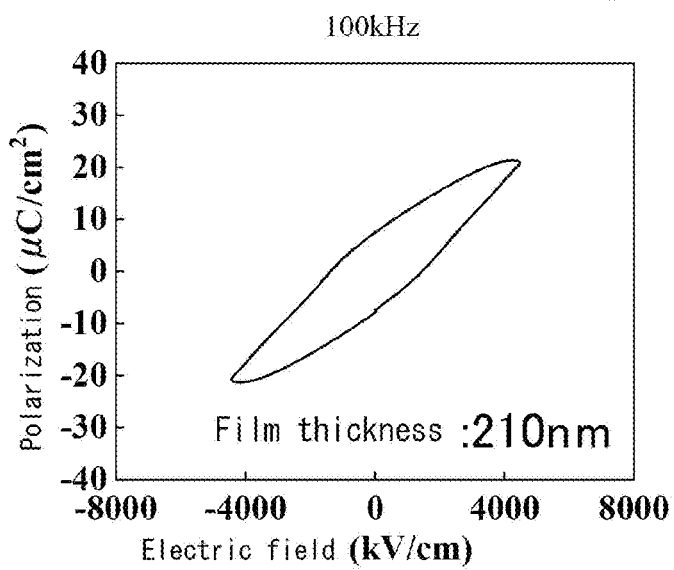
Figures 2, 21:
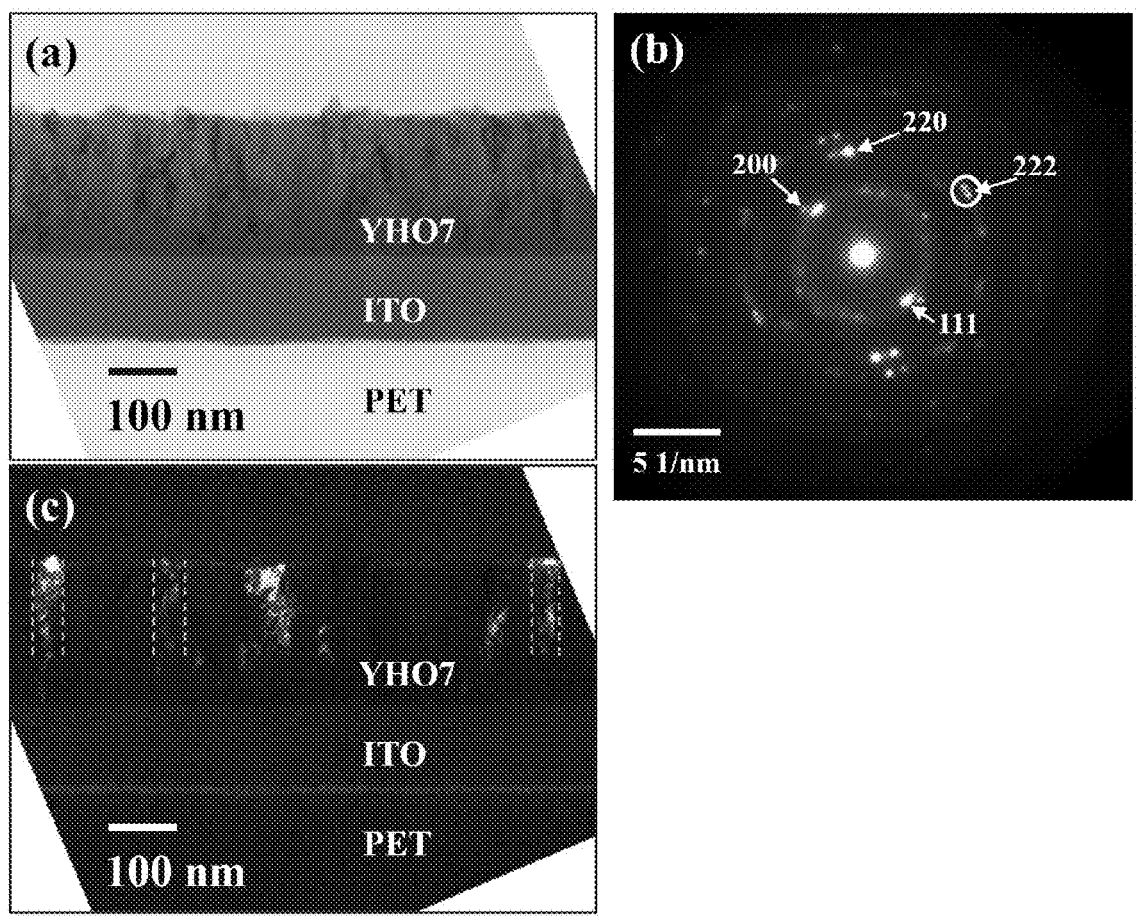

The chart obtained by X-ray diffraction analysis of the obtained 7% $YO_{1.5}$-93% $HfO_2$ film is shown in FIG. 21-1(*a*). From FIG. 21-1(*a*), it was confirmed that the 7%

$YO_{1.5}$-93% $HfO_2$ film was polycrystalline and had a fluorite-type structure of an orthorhombic crystal phase or tetragonal crystal phase.

The result of the polarization hysteresis measurement (polarization-electric field relationship) of this obtained 7% $YO_{1.5}$-93% $HfO_2$ film is shown in FIG. 21-1(b). From FIG. 21-1(b), it was confirmed that the obtained 7% $YO_{1.5}$-93% $HfO_2$ polycrystalline film exhibited ferroelectricity after the hysteresis measurement.

The transmission electron microscope bright field image of the obtained 7% $YO_{1.5}$-93% $HfO_2$ film and the ITO/PET substrate is shown in FIG. 21-2(a), and the select area electron diffraction image of the obtained 7% $YO_{1.5}$-93% $HfO_2$ film is shown in FIG. 21-2(b). Since the diffraction image of FIG. 21-2 (b) shows random spots, it was confirmed that the obtained 7% $YO_{1.5}$-93% $HfO_2$ film was a polycrystalline film. FIG. 21-2(c) shows a transmission electron microscope dark field image imaged using the 222 diffraction of FIG. 21-2(b). It was confirmed that the 7% $YO_{1.5}$-93% $HfO_2$ film was composed of columnar grains having a width of approximately 50 nm, and columnar grains had been formed.

Example 8: YSZ100 Substrate

The film formation of Example 8 was carried out in the same manner as in Example 1 except that the substrate was changed from (111) ITO/(111) YSZ to (100) ITO/(100) YSZ and the film thickness of the 7% $YO_{1.5}$-93% $HfO_2$ film was set to 16 nm and 50 nm. The (100) ITO/(100) YSZ substrate had a (100) ITO film formed on a (100)ITO using (100) oriented YSZ.

The chart obtained by X-ray diffraction analysis of the 7% $YO_{1.5}$-93% $HfO_2$ film having the film thickness of 16 nm obtained by depositing on the (100) ITO/(100) YSZ substrate is shown in FIG. 22(a). From FIG. 22(a), it was confirmed that the 7% $YO_{1.5}$-93% $HfO_2$ film was polycrystalline and had a fluorite-type structure of an orthorhombic crystal phase or tetragonal crystal phase.

The result of the polarization hysteresis measurement (polarization-electric field relationship) of this 7% $YO_{1.5}$-93% $HfO_2$ polycrystalline film is shown in FIG. 22(b). From FIG. 22(b), it was confirmed that the 7% $YO_{1.5}$-93% $HfO_2$ polycrystalline film exhibits ferroelectricity. After the hysteresis measurement, the 7% $YO_{1.5}$-93% $HfO_2$ polycrystalline film exhibited ferroelectricity, confirming that it had an orthorhombic crystal phase.

The chart obtained by X-ray diffraction analysis of the 7% $YO_{1.5}$-93% $HfO_2$ film having the film thickness of 50 nm obtained by depositing on a (100) ITO/(100) YSZ substrate is shown in FIG. 22(c). From FIG. 22(c), it was confirmed that the 7% $YO_{1.5}$-93% $HfO_2$ film was polycrystalline and had a fluorite-type structure of an orthorhombic crystal phase or tetragonal crystal phase.

The result of the polarization hysteresis measurement (polarization-electric field relationship) of this 7% $YO_{1.5}$-93% $HfO_2$ polycrystalline film is shown in FIG. 22(d). From FIG. 22(d), it was confirmed that the 7% $YO_{1.5}$-93% $HfO_2$ polycrystalline film exhibits ferroelectricity. Since the 7% $YO_{1.5}$-93% $HfO_2$ polycrystalline film exhibits ferroelectricity, it was also confirmed that had an orthorhombic crystal phase.

Example 9: Stainless Steel, $Al_2O_3$ (c-plane), SRO/STO Substrate

The film formation of Example 9 was carried out in the same manner as the case in which the substrate temperature of Example 5 was set to room temperature except that the substrate was changed from (111) ITO/(111) YSZ to stainless steel (SUS304), Pt/Si, ITO/$Al_2O_3$ (c-plane), or SRO/STO, and various 7% $YO_{1.5}$-93% $HfO_2$ films were produced. The Pt/Si substrate had (111) Pt having a film thickness of 110 nm deposited on a (001) Si substrate, the ITO/$Al_2O_3$ (c-plane) substrate had (111) ITO having a film of 50 nm deposited on an $Al_2O_3$ (c-plane) substrate, the SRO/STO substrate had conductive (111) $SrRuO_3$ deposited on (111) $SrTiO_3$, and the (111) YSZ substrate was a Y10%-YSZ substrate with a (111) orientation.

Figures 1, 23:
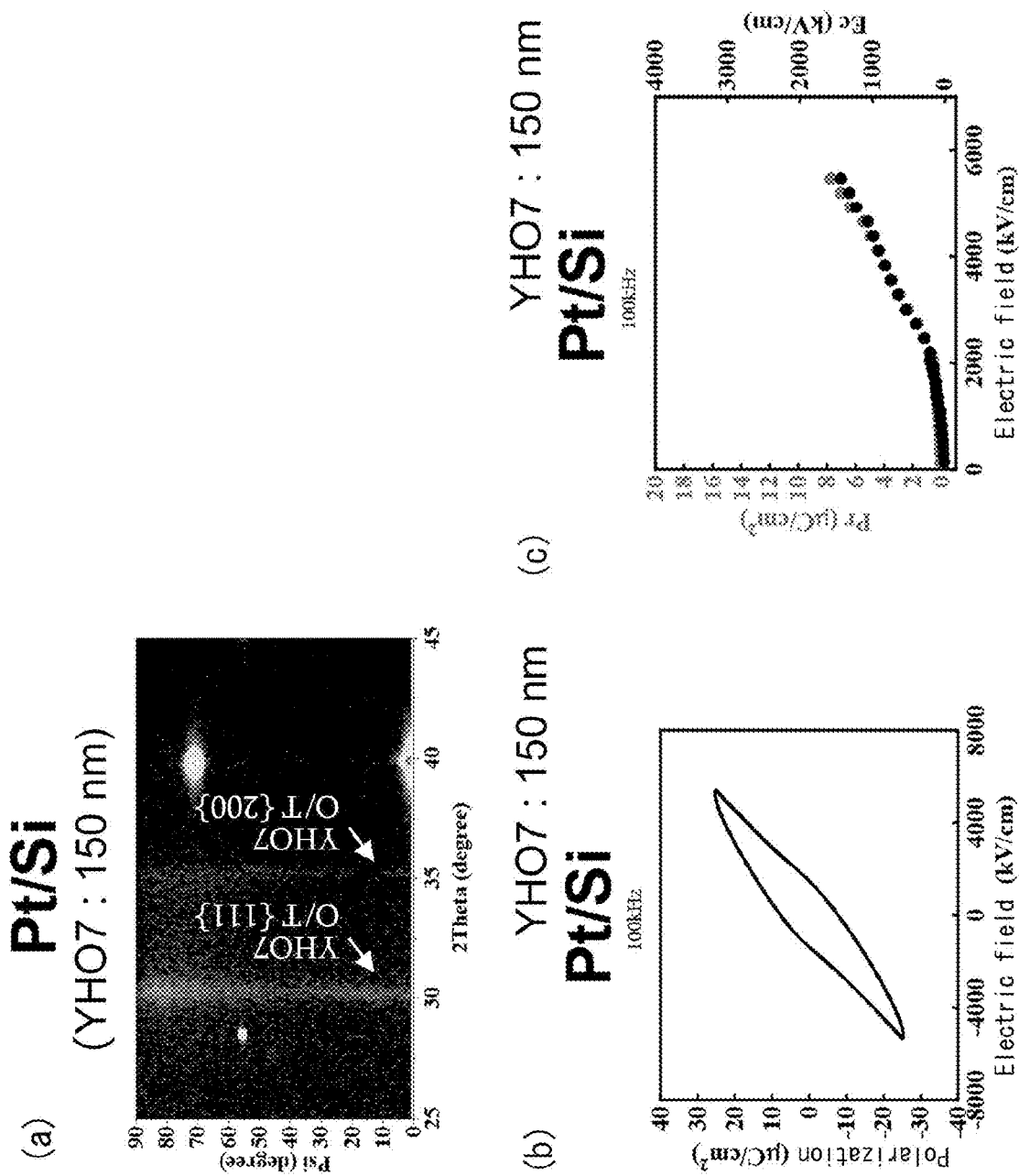
Figures 2, 23:
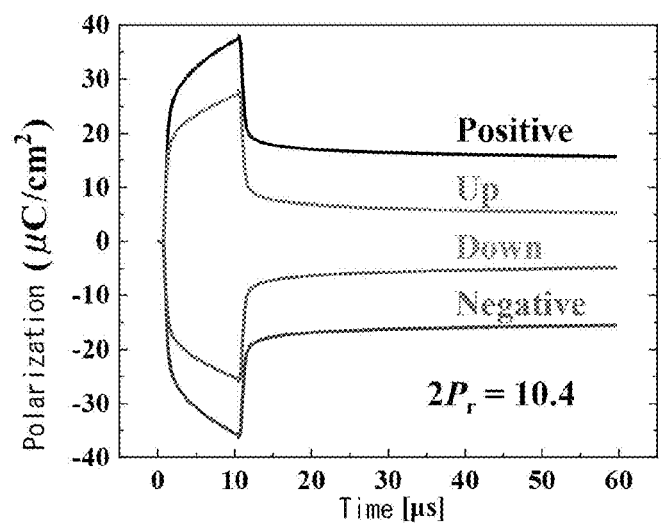
Figure 24:
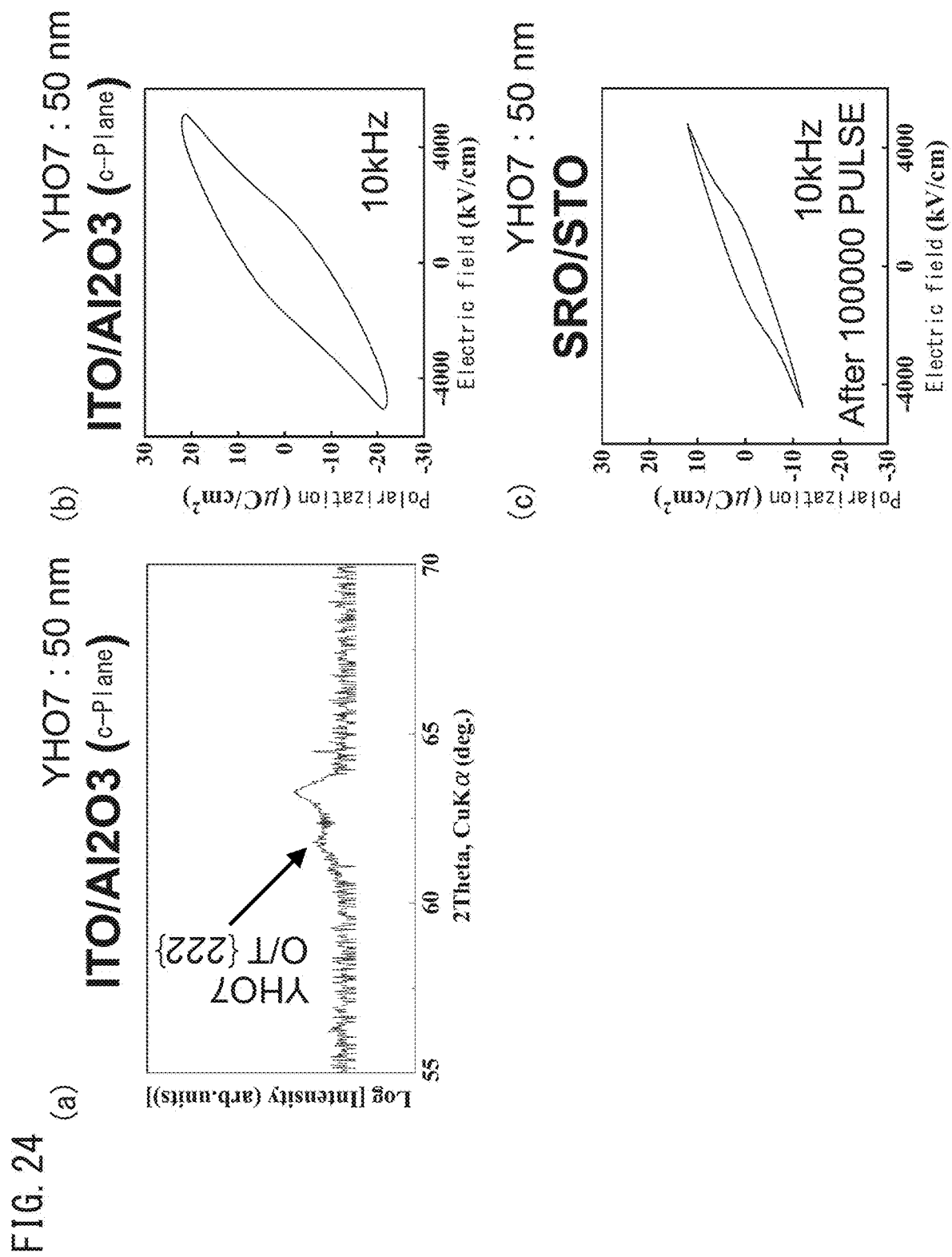
FIG. 24 is polarization hysteresis measurement results (polarization-electric field relationship) and an X-ray diffraction analysis chart of the 7% $YO_{1.5}$-93% $HfO_2$ film obtained on a part of a substrate (ITO/$Al_2O_3$ (c-plane), SRO/STO) in Example 9.

In particular, referring to FIGS. 23-1 to 24, it was confirmed that all of the obtained 7% $YO_{1.5}$-93% $HfO_2$ films exhibited ferroelectricity by polarization hysteresis measurement (polarization-electric field relationship). In the 7% $YO_{1.5}$-93% $HfO_2$ films obtained on the Pt/Si and ITO/$AlO_3$ (c-plane) substrates, X-ray diffraction analysis confirmed that the 7% $YO_{1.5}$-93% $HfO_2$ films were polycrystalline and had a fluorite-type structure of an orthorhombic crystal phase or tetragonal crystal phase, and thus, after the hysteresis measurement, they exhibited ferroelectricity, confirming that they had an orthorhombic crystal phase. The 7% $YO_{1.5}$-93% $HfO_2$ film formed on the SUS304 substrate was subjected to polarization hysteresis measurement (polarization-electric field relationship), and it was confirmed that it exhibited ferroelectricity.

The X-ray diffraction analysis chart of the 7% $YO_{1.5}$-93% $HfO_2$ film formed on the Pt/Si substrate to a film thickness of 150 nm is shown in FIG. 23-1(a). It was confirmed that the 7% $YO_{1.5}$-93% $HfO_2$ film was polycrystalline and had a fluorite-type structure of an orthorhombic crystal phase or tetragonal crystal phase.

FIGS. 23-1(b) and (c) show the results of the polarization hysteresis measurement (polarization-electric field relationship) of the 7% $YO_{1.5}$-93% $HfO_2$ film formed on the Pt/Si substrate at a film thickness of 150 nm. FIG. 23-2 shows the polarization measurement results of PUND (Positive-up-negative-down) for the 7% $YO_{1.5}$-93% $HfO_2$ film on the Pt/Si substrate. From these results, it was confirmed that it exhibited ferroelectricity.

The X-ray diffraction analysis chart and polarization hysteresis measurement (polarization-electric field relationship) of the 7% $YO_{1.5}$-93% $HfO_2$ film formed on the ITO/$Al_2O_3$ (c-plane) substrate to a thickness of 50 nm are shown in FIGS. 24(a) and 24(b). It was confirmed that the 7% $YO_{1.5}$-93% $HfO_2$ film had a fluorite-type structure of an orthorhombic crystal phase or tetragonal crystal phase and exhibited ferroelectricity by hysteresis measurement.

FIG. 24(c) shows the results of the polarization hysteresis measurement (polarization-electric field relationship) of the 7% $YO_{1.5}$-93% $HfO_2$ film formed on the SRO/STO substrate at a film thickness of 50 nm. It was confirmed that it exhibited ferroelectricity.

Example 10: 10 W Power

Figure 25:
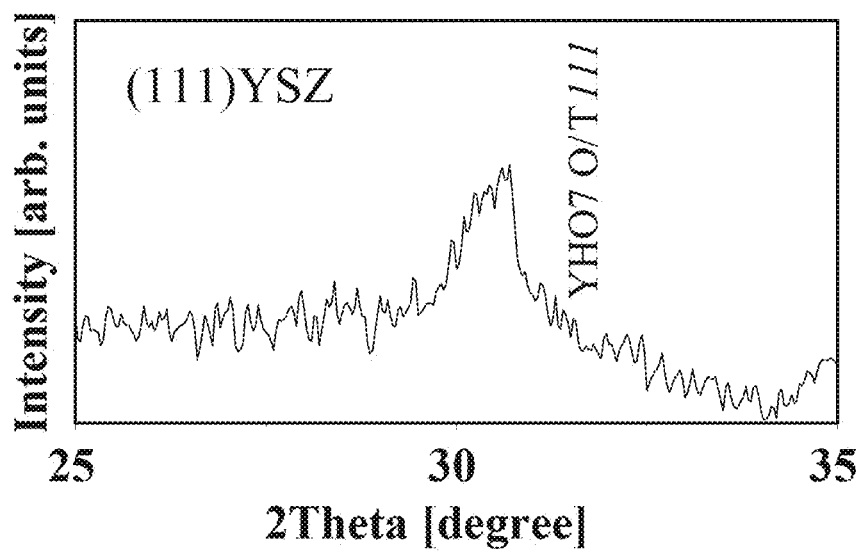
FIG. 25 is an X-ray diffraction analysis chart of the 7% $YO_{1.5}$-93% $HfO_2$ film obtained in Example 10.

Example 10 was carried out in the same manner as in Example 1 except that the sputtering power was changed from 50 W to 10 W. The obtained 7% $YO_{1.5}$-93% $HfO_2$ film was analyzed by X-ray diffraction, and the 7% $YO_{1.5}$-93% $HfO_2$ film had a fluorite-type structure of an orthorhombic crystal phase or a tetragonal crystal phase, and it was confirmed by polarization hysteresis measurement (polarization-electric field relationship) that it exhibited ferroelectricity, thus confirming that it had an orthorhombic crystal phase. FIG. 25 shows the X-ray diffraction analysis chart of the 7% $YO_{1.5}$-93% $HfO_2$ film.

Comparative Example 1: PLD

Film formation was carried out using a pulse laser deposition device. This pulsed laser deposition device had, in a vacuum chamber, a substrate holding means capable of heating a heater, a target setting means, a thermometer, and a gas supply port, and by irradiating the target with the pulsed laser light discharged from the laser light emitter through the lens, a film was formed on the substrate.

An yttria-stabilized zirconia (Y10%-YSZ) oriented in (111) was used as the substrate, and a target in which 7 mol % of yttria (Y) was mixed with hafnium ($HfO_2$) was used as the target. The substrate temperature was set to room temperature. The atmosphere in the chamber was first replaced with argon and evacuated, and then the supply gas was set to 0 sccm for argon and 0.5 sccm for oxygen to achieve an atmosphere of 20 mTorr of oxygen. As the laser light, KrF laser light of 3 $J/cm^2$ was applied to the target as 5 Hz pulsed light.

A 7% $YO_{1.5}$-93% $HfO_2$ film was deposited on the yttria-stabilized zirconia substrate to a thickness of about 20 nm. When the obtained 7% $YO_{1.5}$-93% $HfO_2$ film was subjected to X-ray diffraction analysis, though it was crystalline having a fluorite-type structure, it had a monoclinic crystal phase and a paraelectric (normal dielectric) phase.

Comparative Example 2: PLD

The film formation of Comparative Example 2 was carried out in the same manner as in Comparative Example 1, except that the atmosphere in the chamber was first replaced with argon and evacuated, and then the supply gas was set to 0.5 sccm for argon and 0 sccm for oxygen to achieve an atmosphere of 20 mTorr of argon.

X-ray diffraction analysis of the 7% $YO_{1.5}$-93% $HfO_2$ film formed on a Y10%-YSZ substrate demonstrated that it was crystalline had a fluorite-type structure, but it had a monoclinic crystal phase and a paraelectric (normal dielectric) phase.

Comparative Example 3: PLD

The film formation of Comparative Example 3 was carried out in the same manner as in Comparative Example 1 and Comparative Example 2 except that the substrate was changed from Y10%-YSZ to ITO/glass.

When the 7% $YO_{1.5}$-93% $HfO_2$ film formed on the Y10%-YSZ substrate was subjected to X-ray diffraction analysis, the peak of the 7% $YO_{1.5}$-93% $HfO_2$ film could not be confirmed, and it was confirmed that the film was not crystalline.

Example 11: Polyimide Substrate

The film formation of Example 11 was carried out in the same manner as the case in which the substrate temperature of Example 5 was set to room temperature (unheated) except that the substrate was changed from ITO/YSZ111 to ITO/polyimide and the various 7% $YO_{1.5}$-93% $HfO_2$ films having film thicknesses of 23 nm were produced. The ITO/polyimide substrate had (111) ITO having a film of 15 nm deposited on a polyimide substrate.

Figure 26:
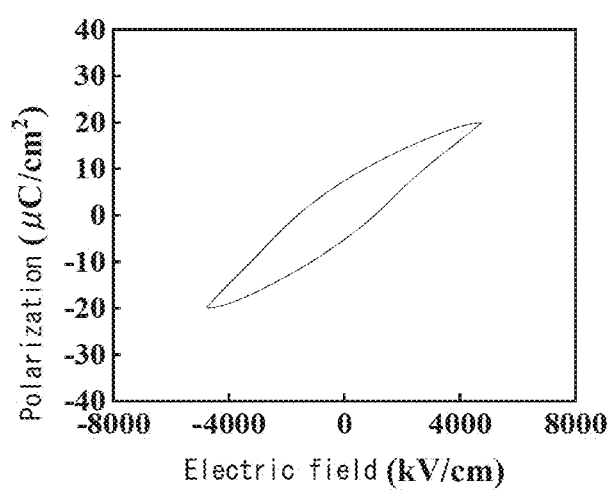
FIG. 26 is a polarization hysteresis measurement result (polarization-electric field relationship) of the 7% $YO_{1.5}$-93% $HfO_2$ film (ITO/polyamide substrate) obtained in Example 11.

As shown in FIG. 26, it was confirmed that the obtained 7% $YO_{1.5}$-93% $HfO_2$ films exhibited ferroelectricity by polarization hysteresis measurement (polarization-electric field relationship). Further, in the 7% $YO_{1.5}$-93% $HfO_2$ films, it was confirmed by X-ray diffraction analysis that the 7% $YO_{1.5}$-93% $HfO_2$ films were polycrystalline and had a fluorite-type structure of an orthorhombic crystal phase or a tetragonal crystal phase. Thus, they exhibited ferroelectricity after hysteresis measurement, and it was confirmed that they had an orthorhombic crystal phase.

Example 12: Epitaxial Film

Example 12 was carried out in the same manner as in Example 1 except that the substrate was changed from ITO/YSZ111 to YSZ100 and the 7% $YO_{1.5}$-93% $HfO_2$ film having a film thickness of 16 nm was formed at room temperature.

Figure 27:
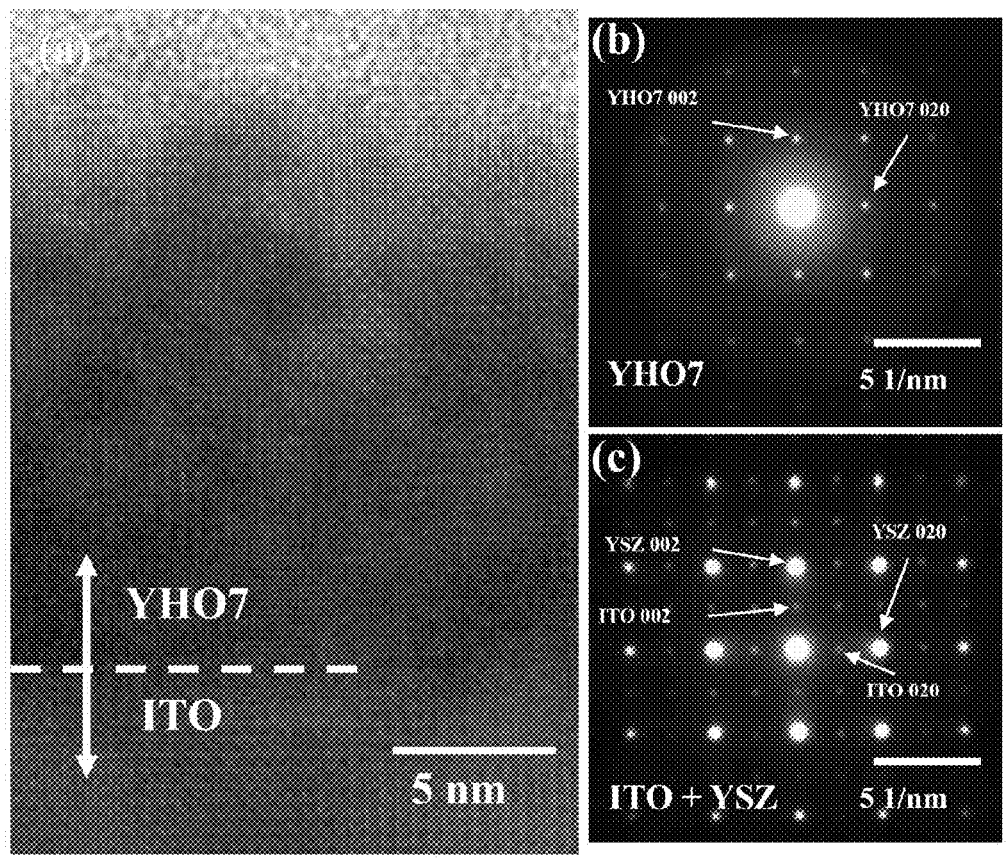
FIG. 27(a) shows a transmission electron microscope bright field image of the 7% $YO_{1.5}$-93% $HfO_2$ film obtained in Example 12.
FIG. 27(b) shows a select area electron diffraction image of the 7% $YO_{1.5}$-93% $HfO_2$ film.
FIG. 27(c) shows a select area electron diffraction image of the ITO electrode and YSZ100 substrate.

A transmission electron microscope bright field image of the obtained 7% $YO_{1.5}$-93% $HfO_2$ film and the ITO/YSZ100 substrate is shown in FIG. 27(a), a select area electron diffraction image of the 7% $YO_{1.5}$-93% $HfO_2$ film is shown in FIG. 27(b), and a select area electron diffraction image of the ITO electrode and YSZ100 substrate is shown in FIG. 27(c). From the lattice image of FIG. 27(a), it was confirmed that the 7% $YO_{1.5}$-93% $HfO_2$ film was crystallized from directly above ITO. In FIGS. 27(b) and 27(c), the atomic arrangement of the 7% $YO_{1.5}$-93% $HfO_2$ film matched the atomic arrangement of the ITO/YSZ100 substrate, and thus, it was confirmed that the 7% $YO_{1.5}$-93% $HfO_2$ film was an epitaxial film lattice-matched with ITO.

Example 13: Film Thickness 20 nm

The film formation of Example 13 was carried out in the same manner as in Example 5 except that the 7% $YO_{1.5}$-93% $HfO_2$ film having a film thickness of 20 nm was formed at room temperature (unheated).

Figure 28:
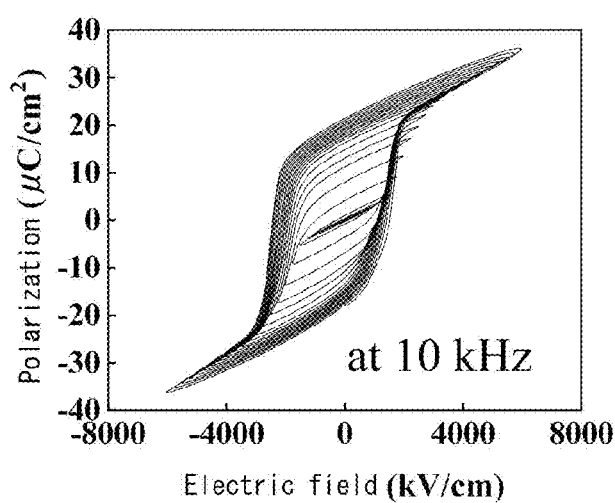
FIG. 28 shows a polarization hysteresis curve (polarization-electric field relationship) of 7% $YO_{1.5}$-93% $HfO_2$ film having a film thickness of 20 nm obtained in Example 14.

From the X-ray diffraction analysis chart, it was confirmed that the 7% $YO_{1.5}$-93% $HfO_2$ film was an epitaxial film and had a fluorite-type structure of a tetragonal crystal phase. The results of the polarization hysteresis measurement of the film are shown in FIG. 28, and it was confirmed that the 7% $YO_{1.5}$-93% $HfO_2$ film exhibited ferroelectricity and had orthorhombic crystal phase.

Example 14: Film Thickness 900 nm

The film formation of Example 14 was carried out in the same manner as in Example 5 except that the 7% $YO_{1.5}$-93% $HfO_2$ film having a film thickness of 900 nm was formed at room temperature (unheated) at a sputtering power of 100 W.

Figure 29:
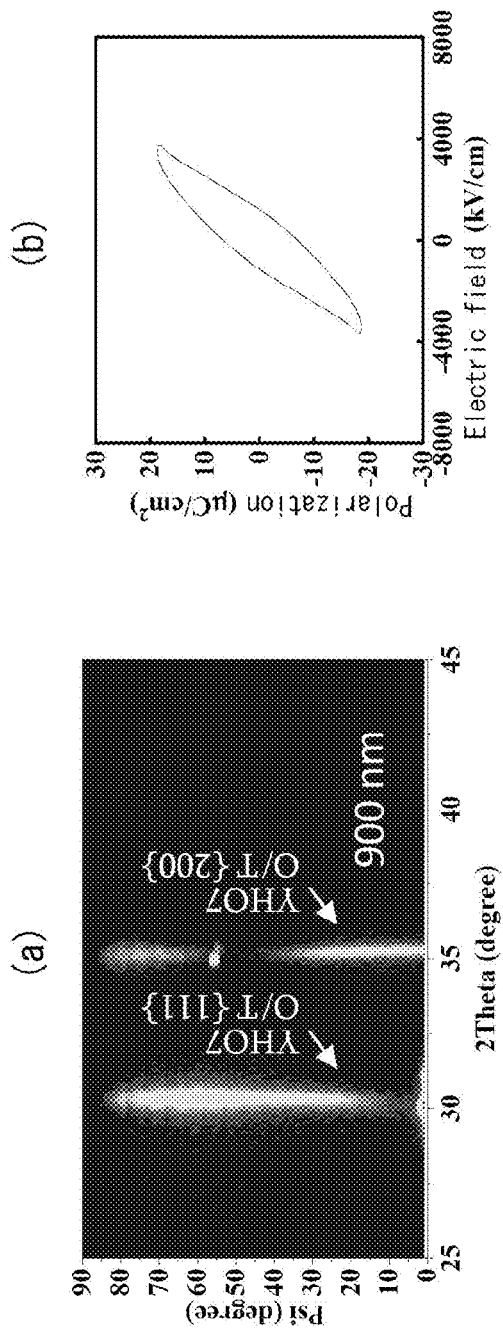
FIG. 29 shows an X-ray diffraction analysis chart and polarization hysteresis measurement results (polarization-electric field relationship) of the 7% $YO_{1.5}$-93% $HfO_2$ film having a film thickness of 900 nm obtained in Example 15.

The X-ray diffraction analysis chart and polarization hysteresis measurement result of the obtained film are shown in FIG. 29, and it was confirmed that it had an orthorhombic crystal phase and exhibited ferroelectricity.

Example 15: 5% $YO_{1.5}$-95% $HfO_2$ Film

The film formation of Example 15 was carried out in the same manner as in Example 5 except that the compositions of the targets were 7% $YO_{1.5}$-93% $HfO_2$ and 5% $YO_{1.5}$-95% $HfO_2$, and a 7% $YO_{1.5}$-93% $HfO_2$ film having a film thickness of 16 nm and a 5% $YO_{1.5}$-95% $HfO_2$ film having a film thickness of 14 nm were formed at room temperature (unheated) at a sputtering power of 50 W.

The X-ray diffraction analysis charts of the obtained 7% $YO_{1.5}$-93% $HfO_2$ film and 5% $YO_{1.5}$-95% $HfO_2$ film are shown in FIG. 30, and the polarization hysteresis measurement result of the same is shown in FIG. 31.

FIG. 30(a) is a 2-Theta-Psi map near the 110 superlattice diffraction of the 7% $YO_{1.5}$-93% $HfO_2$ deposited on the ITO/(111) YSZ substrate at room temperature. No 110 superlattice diffraction from the orthorhombic crystal phase was observed, confirming that this film had a tetragonal crystal phase.

FIG. 30(b) is a 2-Theta-Psi map near the 110 superlattice diffraction of the 5% $YO_{1.5}$-95% $HfO_2$ film deposited on the ITO/(111) YSZ substrate at room temperature. A 110 superlattice diffraction from the orthorhombic crystal phase was observed, confirming that this film had orthorhombic crystal phase.

FIG. 31(a) shows the results of polarization hysteresis measurement (polarization-electric field relationship) of the 16 nm 7% $YO_{1.5}$-93% $HfO_2$ film deposited on the ITO/(111) YSZ substrate at room temperature. From FIG. 31(a), it was confirmed that the 7% $YO_{1.5}$-93% $HfO_2$ film exhibited ferroelectricity. In addition, since the crystal structure analysis showed ferroelectricity even though it was a tetragonal crystal phase after film formation at room temperature, an electric field-induced phase transition from a tetragonal crystal phase to an orthorhombic crystal phase was confirmed.

FIG. 31(b) shows the results of the polarization hysteresis measurement (polarization-electric field relationship) of the 14 nm 5% $YO_{1.5}$-95% $HfO_2$ film deposited on the ITO/(111) YSZ substrate at room temperature. From FIG. 31(b), it was confirmed that the 5% $YO_{1.5}$-95% $HfO_2$ film exhibited ferroelectricity.

FIGS. 31(c) and 31(d) show the residual polarization values Pr and the voltage dependence of the coercive electric field Ec of the 7% $YO_{1.5}$-93% $HfO_2$ film and the 5% $YO_{1.5}$-95% $HfO_2$ film. The residual polarization values can be obtained by applying a voltage of approximately 5000 kV/cm to 7% $YO_{1.5}$-93% $HfO_2$ film and applying a voltage of approximately 3000 kV/cm to the 5% $YO_{1.5}$-95% $HfO_2$ film. It is possible that the electric field for obtaining the remanent polarization value is higher than that of the 5% $YO_{1.5}$-95% $HfO_2$ film, since the 7% $YO_{1.5}$-93% $HfO_2$ film requires an electric field-induced phase transition from a tetragonal crystal phase to an orthorhombic crystal phase to exhibit ferroelectricity.

In FIG. 31(d), there is almost no difference in the residual polarization value Pr and the coercive electric field Ec when the applied voltage was increased (up) and decreased (down), suggesting that an orthorhombic crystal phase had been present before the electric field application, whereas in FIG. 31(c), the difference between the residual polarization value Pr and the coercive electric field Ec when the applied voltage was increased (up) and decreased (down) is remarkable, demonstrating the electric field-induced conversion from a tetragonal crystal phase to an orthorhombic crystal phase.

(Example 16: Annealing at 1000° C.) In Example 6, a 7% $YO_{1.5}$-93% $HfO_2$ film having a film thickness of 16 nm was formed on an ITO/YSZ111 substrate, and then annealed at 1000° C. for 10 seconds in an inlet atmosphere.

Figure 32:
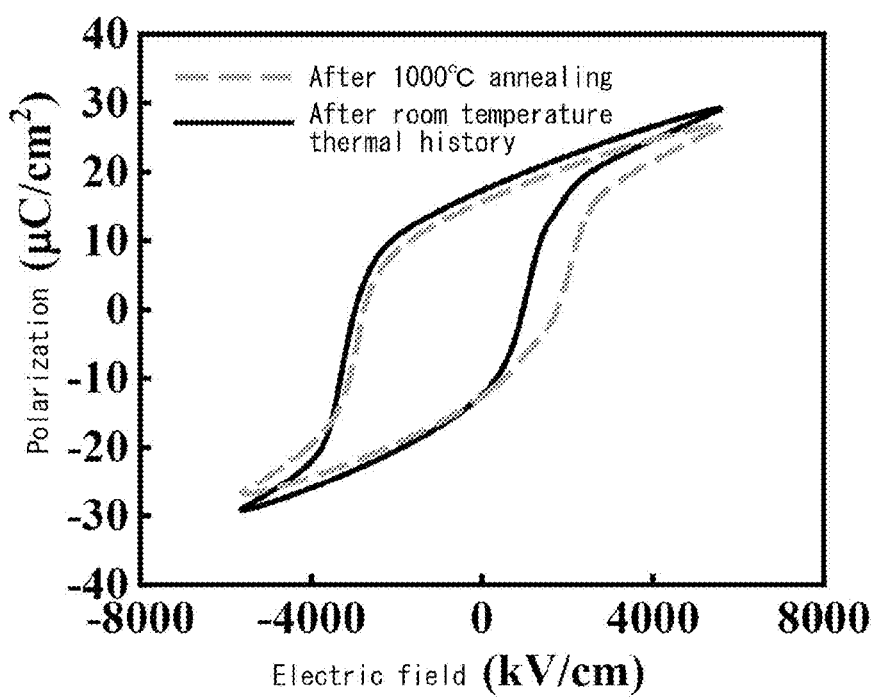
FIG. 32 shows the results of polarization hysteresis measurement (polarization-electric field relationship) of the 7% $YO_{1.5}$-93% $HfO_2$ film before and after annealing obtained in Example 17.

FIG. 32 shows the results of the polarization hysteresis measurement of the film before and after the annealing, after the film formation. A tetragonal crystal phase was present after the deposition at room temperature, but it was confirmed that both before and after the annealing an orthorhombic crystal phase was present after the electric field application. According to FIG. 32, there was no significant difference in the polarization hysteresis before and after the annealing, and a ferroelectric film equivalent to that of the 1000° C. annealed film was obtained by the room temperature deposition.

Example 17: $Hf_{0.75}Zr_{0.25}O_2$ Film

Film formation was carried out in the same manner as in Example 1, except that a target (5% $YO_{1.5}$-95% $Hf_{0.75}Zr_{0.25}O_2$) consisting of a mixture of 95 mol % $Hf_{0.75}Zr_{0.25}O_2$ and 5 mol % of yttria ($YO_{1.5}$) and comprising hafnia ($HfO_2$) and zirconia ($ZrO_2$) at a molar ratio of 75:25 was used and 5% $YO_{1.5}$-95% $Hf_{0.75}Zr_{0.25}O_2$ films having film thicknesses of 27 nm and 13.7 nm were formed at room temperature (without substrate heating).

Figure 33:
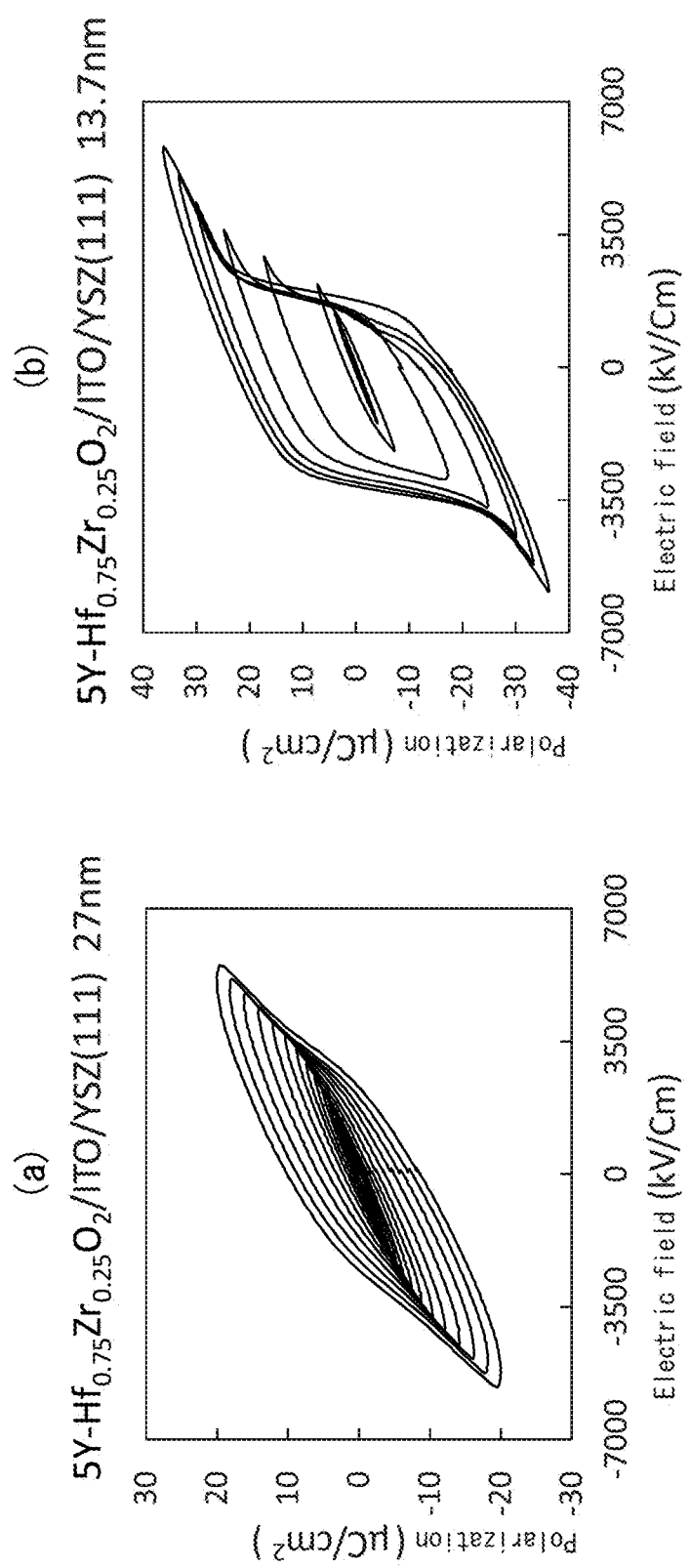
FIGS. 33(a) and 33(b) show polarization hysteresis measurement results (polarization-electric field relationship) of the 5% $YO_{1.5}$-95% $Hf_{0.75}Zr_{0.25}O_2$ film obtained in Example 18.

The polarization hysteresis measurement result of the obtained 27 nm 5% $YO_{1.5}$-95% $Hf_{0.75}Zr_{0.25}O_2$ film is shown in FIG. 33(a). It was confirmed that a ferroelectric film having a fluorite-type structure of an orthorhombic crystal phase was obtained.

The polarization hysteresis measurement result of the obtained 13.7 nm 5% $YO_{1.5}$-95% $Hf_{0.75}Zr_{0.25}O_2$ film is as shown in FIG. 33(b), and it was confirmed that a ferroelectric film having a fluorite-type structure of an orthorhombic crystal phase was obtained.

Example 18: 5% $YO_{1.5}$-95% $Hf_{0.75}Zr_{0.25}O_2$ Film, ITO/YSZ100 Substrate In Example 18, film formation was carried out in the same manner as in Example 17, except that ITO/YSZ100 was used in place of ITO/YSZ111 as the substrate, to form a 5% $YO_{1.5}$-95% $Hf_{0.75}Zr_{0.25}O_2$ film having a film thickness of 27 nm.

It was confirmed from the X-ray analysis chart and the polarization hysteresis measurement result that the obtained 27 nm 5% $YO_{1.5}$-95% $Hf_{0.75}Zr_{0.25}O_2$ film was a ferroelectric film having a fluorite-type structure of an orthorhombic crystal phase.

Figure 34:
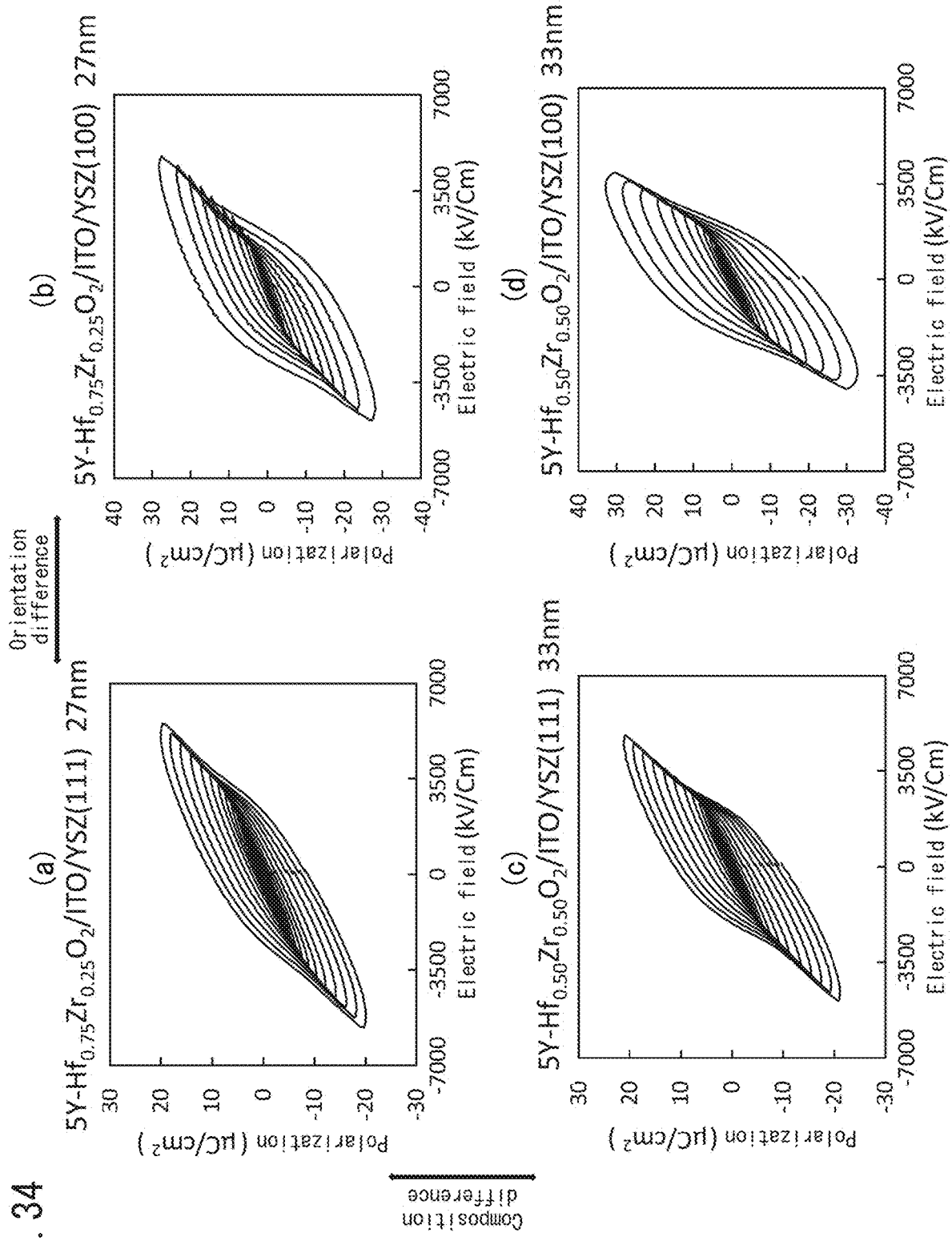
FIG. 34(a) shows the polarization hysteresis measurement result of the 5% $YO_{1.5}$-95% $Hf_{0.75}Zr_{0.25}O_2$ film on the ITO/YSZ111 substrate obtained in Example 19.
FIG. 34(b) shows the polarization hysteresis measurement result (polarization-electric field relationship) of the 5% $YO_{1.5}$-95% $Hf_{0.75}Zr_{0.25}O_2$ film on the ITO/YSZ100 substrate obtained in Example 19.
FIG. 34(c) shows the polarization hysteresis measurement result (polarization-electric field relationship) of the 5% $YO_{1.5}$-95% $Hf_{0.50}Zr_{0.50}O_2$ film on the ITO/YSZ111 substrate obtained in Example 20.
FIG. 34(d) shows the polarization hysteresis measurement result (polarization-electric field relationship) of the 5% $YO_{1.5}$-95% $Hf_{0.75}Zr_{0.25}O_2$ film on the ITO/YSZ100 substrate obtained in Example 20.

FIG. 34(a) shows the polarization hysteresis measurement result of the 5% $YO_{1.5}$-95% $Hf_{0.75}Zr_{0.25}O_2$ film on the ITO/YSZ111 substrate, FIG. 34(b) shows the polarization hysteresis measurement result of the 5% $YO_{1.5}$-95% $Hf_{0.75}Zr_{0.25}O_2$ film on the ITO/YSZ100 substrate.

Example 19: 5% $YO_{1.5}$-95% $Hf_{0.50}Zr_{0.50}O_2$ Film, ITO/YSZ Substrate

In Example 19, film formation was carried out in the same manner as in Example 17, except that ITO/YSZ111 and ITO/YSZ100 were used as the substrates, a target (5% $YO_{1.5}$-95% $Hf_{0.50}Zr_{0.50}O_2$) consisting of a mixture of hafnia ($HfO_2$) and zirconia ($ZrO_2$) at a molar ratio of 50:50 and including 5 mol % yttria ($YO_{1.5}$) relative to a total of 95 mol % of hafnia ($HfO_2$) and zirconia ($ZrO_2$) was used as the target to obtain a 5% $YO_{1.5}$-95% $Hf_{0.50}Zr_{0.50}O_2$ film having a film thickness of 33 nm at room temperature (without substrate heating).

It was confirmed from the X-ray analysis chart and the polarization hysteresis measurement result that the obtained 33 nm 5% $YO_{1.5}$-95% $Hf_{0.50}Zr_{0.50}O_2$ film was a ferroelectric film having a fluorite-type structure of an orthorhombic crystal phase on both the ITO/YSZ111 and ITO/YSZ100 substrates.

FIG. 34(c) shows the polarization hysteresis measurement result of the 5% $YO_{1.5}$-95% $Hf_{0.50}Zr_{0.50}O_2$ film on the ITO/YSZ111 substrate and FIG. 34(d) shows the polarization hysteresis measurement result of the 5% $YO_{1.5}$-95% $Hf_{0.75}Zr_{0.25}O_2$ film on the ITO/YSZ100 substrate.

Example 20: 5% $YO_{1.5}$-95% $Hf_{0.50}Zr_{0.50}O_2$ Film, Pt/Si Substrate

In Example 20, film formation was carried out in the same manner as in Example 19, except that a Pt/Si substrate of a different Pt film deposition temperature was used in place of the ITO/YSZ as the substrate to form a 5% $YO_{1.5}$-95% $Hf_{0.50}Zr_{0.50}O_2$ film having a film thickness of 33 nm.

It was confirmed from the X-ray analysis chart and the polarization hysteresis measurement result that the obtained 33 nm 5% $YO_{1.5}$-95% $Hf_{0.50}Zr_{0.50}O_2$ film was a ferroelectric film having a fluorite-type structure of an orthorhombic crystal phase on the Pt/Si substrate.

Figure 35:
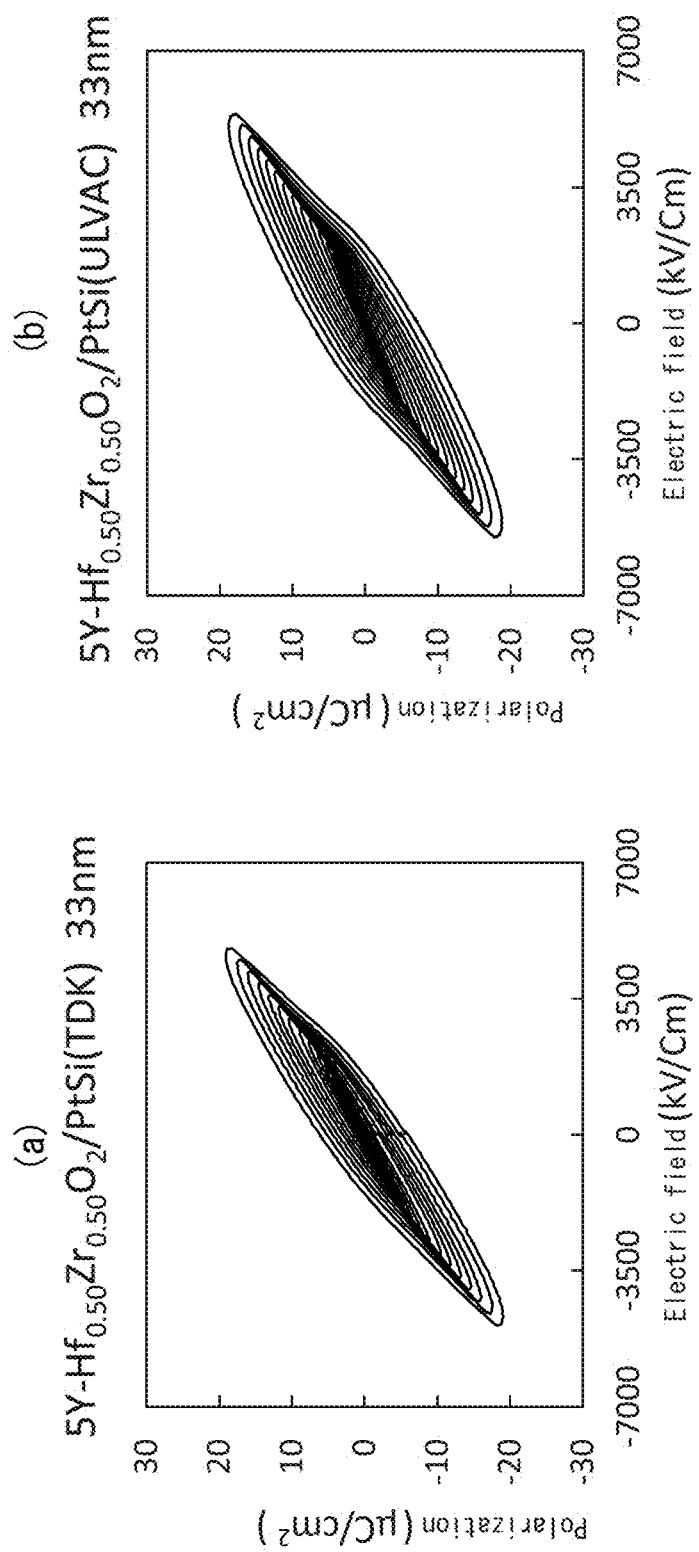
FIG. 35 shows polarization hysteresis measurement results (polarization-electric field relationship) of the 5% $YO_{1.5}$-95% $Hf_{0.50}Zr_{0.50}O_2$ film on the Pt/Si substrate of different Pt film formation temperatures, in place of the ITO/YSZ as the substrate, obtained in Example 21.

The polarization hysteresis measurement results of the 5% $YO_{1.5}$-95% $Hf_{0.50}Zr_{0.50}O_2$ films on the Pt/Si substrate having the different Pt deposition temperatures in place of the ITO/YSZ substrate are shown in FIGS. 35(a) and 35(b).

REFERENCE SIGNS LIST 1 vacuum chamber
2 substrate
3 target
4 power supply
5 gas introduction system
10 sputtering device

The invention claimed is:

1. A production process of a ferroelectric film, which comprises
    using a sputtering method comprising sputtering a target at a temperature of a substrate of 250° C. or lower, to deposit on the substrate a film of a metal oxide which is capable of having a fluorite-type structure of an orthorhombic crystal phase, and
    having a thermal history of said film of 250° C. or lower at the time of said sputtering and after said sputtering, or applying an electric field to said film which has a thermal history of 250° C. or lower at the time of said sputtering and after said sputtering,
    whereby a ferroelectric film comprising a crystalline metal oxide having a fluorite-type structure of an orthorhombic crystal phase is produced.

2. The production method of a ferroelectric film according to claim 1, wherein the metal of said metal oxide comprises hafnium (Hf), zirconium (Zr), cerium (Ce), or two or more of these, or comprises hafnium (Hf), zirconium (Zr), cerium (Ce), or two or more of these and at least one metal element selected from the group consisting of aluminum (Al), silicon (Si), strontium (Sr), barium (Ba) and rare earth elements (Sc, Y, La, Ce, Pr, Nd, Sm, Eu, Gd, Tb, Dy, Ho, Er, Tm, Yb, and Lu).

3. The production method of a ferroelectric film according to claim 1, wherein said sputtering is carried out in an inert atmosphere having an oxygen partial pressure of less than 1%.

4. The production method of a ferroelectric film according to claim 1, wherein said substrate is selected from the group consisting of a substrate comprising a glass having a glass transition point of 250° C. or lower, a substrate comprising a macromolecular organic layer, a substrate comprising a metal layer having a softening temperature of 250° C. or lower, and an inside of a semiconductor device.

* * * * *